United States Patent
Nishihara et al.

(10) Patent No.: US 6,336,209 B1
(45) Date of Patent: Jan. 1, 2002

(54) INFORMATION PROCESSING SYSTEM THAT PROCESSES PORTIONS OF AN APPLICATION PROGRAM USING PROGRAMMABLE LOGIC CIRCUITS

(75) Inventors: Yoshio Nishihara; Yoshihide Sato; Norikazu Yamada; Hiroyuki Miyake; Eigo Nakagawa, all of Nakai-machi (JP)

(73) Assignee: Fuji Xerox, Co., LTD, Tokyo (JP)

(*) Notice: Subject to any disclaimer, the term of this patent is extended or adjusted under 35 U.S.C. 154(b) by 0 days.

(21) Appl. No.: 09/280,681

(22) Filed: Mar. 29, 1999

(30) Foreign Application Priority Data

Jun. 17, 1998 (JP) .......................................... 10-169440

(51) Int. Cl.$^7$ ........................ G06F 17/50; H03K 19/00
(52) U.S. Cl. ............................ 716/17; 716/7; 716/10; 716/18; 326/47
(58) Field of Search .............................. 716/7, 10, 17, 716/18; 326/47

(56) References Cited

U.S. PATENT DOCUMENTS

| | | | |
|---|---|---|---|
| 4,700,187 A | | 10/1987 | Furtek ................. 340/825.83 |
| 5,426,591 A | * | 6/1995 | Ginetti et al. ................ 716/6 |
| 5,572,712 A | * | 11/1996 | Jamal ......................... 716/18 |
| 5,764,525 A | * | 6/1998 | Mahmood et al. ........... 716/18 |
| 5,808,921 A | * | 9/1998 | Gold et al. ................. 702/108 |
| 5,937,190 A | * | 8/1999 | Gregory et al. ............. 717/4 |
| 6,131,109 A | * | 10/2000 | Gregory et al. ............. 717/4 |

FOREIGN PATENT DOCUMENTS

JP A-6-232259 8/1994
JP A-10-78932 3/1998

OTHER PUBLICATIONS

Verschueren, A.C., "Rule Base Driven Conversion of an Object Oriented Design Data Structure into Standard Hardware Description Languages", Euromicro Conference, 1998, vol. 1, pp. 42–45.*
Configurable Logic; PLD =FPGA •GATE ARRAY; Data Book, Aug. 1995.
The Programmable Logic Data Book; XC6200—Field Programmable Gate Arrays, Version 1.0, Jun. 1996.

* cited by examiner

Primary Examiner—Matthew Smith
Assistant Examiner—Jibreel Speight
(74) Attorney, Agent, or Firm—Oliff & Berridge, PLC

(57) ABSTRACT

By reusing circuit information designed in the past, the amount of computation for combining circuit information for layout and wirings is significantly reduced. A memory part stores a plurality of pieces of circuit information for forming circuits in programmable logic circuits. Each of pieces of the circuit information has an identifier of its own circuit information, and in the case where part or all of the circuit information is formed with other circuit information, has the identifiers of the other circuit information as reference identifiers, as circuit data thereof. An acquisition part passes specification circuit information from an application program to an editing part, obtains circuit information of a specified circuit, sent from the editing part, and forms the specified circuit in the programmable logic circuits according to the circuit information. The editing part generates circuit information of a circuit specified by specification information from the acquisition part from circuit information of the specified circuit and other circuit information indicated by reference identifiers, obtained from the memory part.

19 Claims, 28 Drawing Sheets

INFORMATION PROCESSING SYSTEM THAT PROCESSES PORTIONS OF AN APPLICATION PROGRAM USING PROGRAMMABLE LOGIC CIRCUITS

BACKGROUND OF THE INVENTION

1. Field of the Invention

The present invention relates to an information processing system in which at least part of processing by application programs can be performed with reconfigurable programmable logic circuits. Also, the present invention relates to a circuit information management method and a circuit information storage device well-suited to the information processing system.

2. Description of the Prior Art

In the field of digital circuit elements, particularly application specific integrated circuits (ASIC), in order to reduce the development term of products, programmable logic circuits are widely used which comprise field programmable gate arrays (FPGA), programmable logic devices (PLD), and the like.

These programmable logic circuits, by loading circuit information describing logic circuits into them, permit the connections between internal logic circuits to be freely formed. Accordingly, the use of programmable logic circuits has the merit of eliminating the time for manufacturing integrated circuits, which has conventionally required from several weeks to several months after the end of circuit design. Particularly, as described in U.S. Pat. No. 4,700,187, electrically reconfigurable programmable logic circuits have the advantage of being able to be changed freely any number of times after once manufactured, so that they are being used more and more widely.

One example of a device for designing this type of programmable logic circuit is described in a patent specification entitled "Device and Method for Designing FPGA Circuits" (Japanese Published Unexamined Patent Application No. Hei 6-232259). This example, as a prior art example 1, will be described with reference to FIGS. 28 and 29.

FIG. 28 shows the configuration of a CAD system to design a large-sized FPGA circuit. This device has a database 12 in which a plurality of hard macro cells comprising FPGA function modules containing layout and wiring information and logic function information are cataloged, and designs a larger-sized FPGA integrated circuit by using the plurality of hard macro cells cataloged in the database for layout and wirings.

In this device, a designer operates a data input-output device 10 as a man-machine interface to run a file management program group 11. The file management program group 11 includes a logic file management program, a library management program, a layout and wiring management program, and the like to manage the database 12.

The database 12 comprises a logic file in which a plurality of pieces of FPGA logic function information are stored, a cell library in which FPGA cells as function modules are cataloged, and a layout and wiring file in which layout and wiring information internal to and external to FPGA is stored. In the cell library, multiple hard macro cells are cataloged which in advance have layout and wiring information and logic function information and execute specific functions as peripheral circuits and the like. The contents of each file of the database 12 are read for diagnosis from a diagnostic system 13 as required, and the diagnostic data 14 is outputted.

By sequentially using a drawing input system, a net list generation system, a layout system, an in-cell layout and wiring system, and an output program according to the contents of the files stored in the database, design drawings and a program for implementing a large-sized FPGA circuit are outputted.

FIG. 29 shows an example of the configuration of one-chip FPGA-based microcomputer system designed by the CAD system. The FPGA chip 20 comprises a CPU 21, a ROM 22, a RAM 23, an I/O port 24, a PIT (Programmable Interval Timer) 25 to measure an elapsed time of a program to be processed, a PIC (Programmable Interrupt Controller) 26 to control concurrent interrupt signals from a plurality of devices, and a DMAC (Direct Memory Access Controller) 27 to arbitrate necessary memory accesses with the CPU 21, each of which is connected to an address/data bus 28 and a control signal line 29.

Of these components, hard macro cells corresponding to the I/O port 24, PIT 25, PIC 26, and DMAC 27 are cataloged in advance in the cell library of the database 12 and, by simply reading the hard macro cells as they are and mapping them onto the FPGA chip 20, the hard macro cells can be laid out within the FPGA cells.

In the way described above, according to the prior art example 1, by using a library in which a plurality of hard macro cells comprising FPGA function modules having layout and wiring information and logic function information in advance are cataloged, and making layout and wirings using the plurality of hard macro cells cataloged in the library, a less heavily loaded system design can be made within a shortened development term, taking advantage of existing FPGA circuits as intellectual property.

Although the prior art example 1 described above relates to invention on the designing of one FPGA chip, recent logic circuits are increasing in complexity and their circuit scale has become large to such an extent that it cannot be achieved by one programmable logic circuit device.

As one method for solving this problem, a method is proposed which re-forms programmable logic circuits in the middle of processing to implement different logic circuits at different times. This method is advantageous in that various processing can be performed relatively quickly even in portable information terminals or the like, which are limited in the size of internal circuits because of their compact size.

However, one disadvantage of this method is that a programmable logic circuit requires much time to re-form because circuit information of the entire circuit should be read again. Moreover, re-forming in the middle of processing requires extra processing, that is, temporarily stopping processing, saving data at that time to a storage external to the programmable logic circuit, reading new circuit information for the re-forming, and inputting the data before the re-forming and new data for the re-forming. Input and output of data is redundant.

To solve this problem, a programmable logic circuit described in a data book entitled "CONFIGURABLE LOGIC" published by Atmel Corporation, a U.S. company and a programmable logic circuit described in a data book entitled "THE PROGRAMMABLE LOGIC" published by Xilinx, Inc., a U.S. company have a data storage for storing data and are partially re-formed by reading part of circuit information from the external storage even during operation of the circuits, thereby minimizing the time required for re-forming.

A problem with the use of such a programmable logic circuit in an information processing system is that re-forming into a desired logic circuit must be performed quickly and efficiently by retrieving circuit information for forming the desired logic circuit from a storing destination and synthesizing a plurality of pieces of circuit information, as required, to a format suitable for processing.

An information system that re-forms the above-described plurality of pieces of circuit information into a programmable logic circuit at different times and performs predetermined processing can be connected to a network for use. An example of this is a "reconfigurable network computer" described in Japanese Published Unexamined Patent Application No. Hei 10-78932, which will be described below as a prior art example 2 with reference to FIG. 30.

An information processing system of the prior art example 2 comprises a plurality of computers connected to a communication network NET, at least one of which is a computer (application server) SB that distributes an application program and the remainder are client computers CL that down-load and execute the application program. Extended hardware (extended HW) 31 that can be functionally changed as required by a program and be re-formed is installed in part of the plurality of client computers CL.

The application program AP stored in the server SB, for part of functions thereof, contains program codes (extended codes) of the extended hardware and codes of the main processor (main P) 32 of a client computer CL.

The OS of a client computer CL has a function to judge whether the extended hardware 31 is installed, and if it is installed, has a code selection function 33 to retrieve only codes suitable for the hardware configuration from the application program AP, like the upper client computer CL in FIG. 30. Like the lower client computer CL in FIG. 30, if the extended hardware 31 is not installed, the codes of the main processor 32 are selected by the code selection function 33 so that the application can be used.

In another configuration, functions implemented by the extended hardware 31 are implemented as OS extended functions or dynamic libraries that can be dynamically added and deleted later onto a client computer CL, and the application program AP registers the type of extended functions or dynamic libraries used in the process of processing to the OS. The OS uses extended functions or dynamic libraries on the client, if any, and otherwise, transfers required extended functions or dynamic libraries from the server SB on the network NET to use them.

Codes for the main processor 32 and codes for the extended hardware 31 are not united, but different codes may be provided on a host computer, for each of application programs AP, OS extended functions, or dynamic libraries.

Furthermore, in the case of the prior art example 2, when the configurations of programmable logic circuits comprising the extended hardware are different among clients, the extended codes may be replaced by codes representing basic modules that describe the functions of logic circuits comprising proper numbers of gates and input-output pins by Boolean expressions and the like, and connection relationships among them. The basic modules can be referenced by other circuits for reuse as intellectual property.

Furthermore, the server or clients are provided with a function to allocate the basic modules respectively to the basic programs of programmable logic circuits, and a function, when an extended code is large enough to extend to a plurality of programmable logic circuit chips, to split the basic modules according to the degree of connections before laying them out on each programmable logic circuit chip.

Also, a hardware resource management function and a code interchange function are provided. The former reuses disused hardware resources for other application programs so that a plurality of applications using the extended hardware can be executed concurrently, and the latter interchanges extended codes not fitting within the extended hardware in time sharing mode.

There is also provided an extended hardware management function that performs selection for a plurality of application programs not fitting within hardware resources, based on a priority value set for each application program executed on a client, the processing capability value of a main processor, the processing capability value of extended hardware, the amount of hardware resource, and a processing capability value required for code interchange.

When a plurality of applications use an identical extended code at the same time in the extended hardware, only internal states are switched in time sharing mode and functions are shared.

As has been described above, in the case of the prior art example 2, when the application program distributed from the server is executed on a computer connected over the network at a client, the client is provided with extended hardware that is functionally changed as required by a program and is reconfigurable, the application program stored in the server is made to contain main processor codes of the client and extended codes, the configuration of the client computer is changed to suit processing by the code selection function to determine the existence and type of the extended hardware, whereby the application program can be executed quickly.

In an attempt to start new service requiring clients to have special hardware, conventionally, users at the clients have been required to install new hardware for this purpose and the service provider has offered the new service only to limited users having the new hardware. However, by implementing the above-mentioned prior art example 2, the new service can be started without installing the new hardware.

As has been described above, use of the FPGA circuit design device and method of the prior art example 1 would allow FPGA circuits designed previously to be reused as hard macro cells but require the task of combining the hard macro cells to produce circuits that actually function.

To combine the hard macro cells, in the case of the prior art example 1, while viewing data 14 of diagnostic results in the diagnostic system 13, a circuit designer references FPGA cells including hard macro cells cataloged in the cell library of the database and inputs a circuit drawing in the drawing input system. A net list is generated from the inputted circuit drawings in the net list generation system, and according to the generated net list, hard macro cells are laid out in the layout system, and wirings among the hard macro cells are made in the in-cell layout and wiring system.

For this reason, reusing hard macro cells to design one circuit would contribute to reduction in a design term in comparison with the case of designing all circuits. However, there is still a problem that computational complexity and time for laying out and connecting hard macro cells are required.

Also, the designer must input circuit drawings while referencing hard macro cells cataloged in the cell library. Furthermore, there is a problem that a system becomes large, because of the need for a system that generates a net list from inputted circuit drawings, a layout system that lays out hard macro cells, and an in-cell layout and wiring system that connects hard macro cells.

In other words, the prior art example 1 is useful for efficiently designing an FPGA chip having a high integration level by using hard macro cells designed previously to design a specific circuit without constraints of time, as in the case of designing circuits formed on an ASIC, for example, whereas, for example, in an attempt to perform processing of part of an application program by programmable logic circuits instead of software processing, this technique is unsuitable for creation of information of circuits to be formed in the programmable logic circuits.

On the other hand, if a network computer device of the prior art example 2 is used, by using extended codes passed from a server SB, processing of part of an application program can be performed by hardware without installing new hardware, so that rapid processing of the application program by hardware becomes possible.

At this time, in the prior art example 2, circuit information of circuits formed in programmable logic circuits such as extended hardware must be stored, for each circuit, before an application program is executed, as extended codes in the application program, OS extended functions, or dynamic libraries added to the program during execution.

For this reason, each of client computers must have a storage unit to store circuit information of circuits formed in programmable logic circuits even when it does not have extended hardware.

In the case of the prior art example 2, one circuit may be comprised of a collection of basic modules having smaller functions. The basic modules, which are available for reference from other circuits, can be reused as intellectual property.

However, one problem is that, as described above, if a client computer is provided with circuit information stored as extended codes, which is comprised of a collection of basic modules, when one of the basic modules must be modified or improved, the whole of the circuit Ad information stored in the client computer must be re-created from the beginning.

SUMMARY OF THE INVENTION

An object of the present invention is to offer an information processing system that processes at least part of an application program with programmable logic circuits, wherein the information processing system need not have circuit information of the programmable logic circuits in advance.

Another object of the present invention is to significantly reduce computational complexity for combining circuit information for layout and wirings although circuit information designed previously is reused.

Still another object of the present invention is to enable a highly flexible re-forming of circuit information for forming circuits in the event of modifications and improvements of the circuit information so that an application program using circuits formed in programmable logic circuits can perform processing, without the need to create the circuit information, for example, by combining a plurality of basic modules, before the application program is started.

To solve the above-mentioned problems, an information processing system according to a first invention that performs at least part of processing of an application program with programmable logic circuits, comprises:

a processing part that includes the programmable logic circuits and performs processing using circuits formed in the programmable logic circuits by instructions from the application program;

a memory part that stores a plurality of pieces of circuit information for forming the circuits in the programmable logic circuits;

an editing part that includes a function to generate circuit information of one circuit specified by specification information by using the plurality of pieces of circuit information stored in the memory part; and an acquisition part that, to identify a circuit to be formed in the programmable logic circuits, passes information specified by the application program, as the specification information, to the editing part, obtains circuit information of the circuit specified by the specification information wherein the circuit information arrives from the editing part, and forms the specified circuit in the programmable logic circuits of the processing part by the circuit information.

An information processing system of a second invention is characterized in the first invention in that:

a portion constituting the memory part, a portion constituting the editing part, and a portion constituting the acquisition part and the processing part are connected over a network.

An information processing system of a third invention is characterized in the first or second invention in that:

each of the plurality of pieces of circuit information stored in the memory part has an identifier of its own circuit information, and in the case where part or all of the circuit information is formed with other circuit information, has the identifiers of the other circuit information as reference identifiers, as circuit data for forming circuits in the programmable logic circuits; and the editing part generates circuit information of a circuit specified by the specification information passed from the acquisition part by obtaining the circuit information of the specified circuit and the other circuit information indicated by the reference identifier from the memory part.

An information processing system of a fourth invention is characterized in the third invention in that:

the editing part, in response to the specification information from the acquisition part, inquires of the memory part about circuit information of a circuit specified by the specification information by an identifier thereof;

the memory part, in response to the inquiry from the editing part, if circuit information indicated by the identifier at the inquiry contains a reference identifier, returns the reference identifier to the editing part; and the editing part uses the reference identifier obtained from the memory part to obtain the other circuit information indicated by the reference identifier from the memory part.

An information processing system of a fifth invention is characterized in the first or second invention in that:

each of the plurality of pieces of circuit information stored in the memory part comprises a circuit data unit and an additional information unit thereof;

the additional information unit contains an identifier of its own circuit information, and in the case where part or all of the circuit information is formed with other circuit information, contains the identifiers of the other circuit information as reference identifiers;

the circuit data unit is for forming circuits in the programmable logic circuits, and in the case where part or all of the circuit information is formed with other circuit information, circuit data of the part or all of the circuit information is described using the reference identifiers;

the editing part, in response to the specification information from the acquisition part, inquires of the memory part about circuit information of a circuit specified by the specification information by an identifier thereof;

the memory part, in response to the inquiry from the editing part, if the additional information unit of circuit information indicated by the identifier at the inquiry contains a reference identifier, returns the reference identifier to the editing part; and the editing part uses the reference identifier obtained from the memory part to obtain the other circuit information indicated by the reference identifier from the memory part.

An information processing system of a sixth invention is characterized in the fifth invention in that:

the circuit data unit of the circuit information stored in the memory part is described by pairs of the address of a configuration memory of the programmable logic circuits and circuit data stored in the address; and in the case where part or all of the circuit information is formed with other circuit information, the reference identifiers are described as circuit data of addresses corresponding to positions where the other circuit information is referenced in the circuit information.

An information processing system of a seventh invention is characterized in the sixth invention in that:

the editing part links the other circuit information corresponding to the reference identifier to circuit information in which the reference identifier is contained, in such a way that the address at which the reference identifier is described as circuit data of circuit information of a circuit specified by the specification information is added to all the addresses of the circuit data unit of the other circuit information corresponding to the reference identifier.

[Action]

In an information processing system of the first invention, during execution of an application program, in order to have the application program perform processing with programmable logic circuits of the processing part, information for identifying a circuit to be formed in the programmable logic circuits is sent to the acquisition part. The acquisition part passes the information to the editing part as specification information of circuit information. The editing part sends the specification information to the memory part.

The memory part returns circuit information specified in the specification information to the editing part. The editing part receives it, and if other circuit information in the memory part is also required to generate specified circuit information, obtains the other circuit information from the memory part. The editing part generates specified circuit information from a plurality of pieces of circuit information obtained from the memory part and returns it to the acquisition part as information requested by the specification information. The acquisition part re-forms the circuit information obtained from the editing part in the programmable logic circuits of the processing part.

The processing part can perform processing designated by the application program by using the circuits re-formed in the programmable logic circuits.

As has been described above, in the information processing system of the first invention, if specification information is passed to the acquisition part during execution of an application program, in response to requests from the acquisition part, the editing part automatically generates circuit information to be formed on programmable logic circuits of the processing part and returns it to the acquisition part, and the acquisition part re-forms the circuit information in the programmable logic circuits, so circuit information need not be stored in advance within an application program or the like.

In the information processing system of the second invention, a portion constituting the memory part, a portion constituting the editing part, and a portion constituting the acquisition part and the processing part are connected over a network, so that the editing part and the memory part need not be provided within one information processing apparatus. Accordingly, to the acquisition part, the processing part, and the application processing apparatus operating with application programs, the system appears to be constructed so that, if specification information is sent over a network, circuit information corresponding to the specification information is automatically sent; the memory part, the editing part, and the acquisition part and processing part can be freely organized.

In the information processing system of the third invention, circuit information stored in the memory part has a so-called tree structure, with circuit information consisting of circuit data not referencing other circuits at the lowest layer.

That is, each piece of circuit information has, e.g., a circuit name as its own identifier. Each piece of the circuit information, when part or all thereof is formed with other circuit information, has, as circuit data, the identifiers of the other circuit information as reference identifiers. As the reference identifiers, the circuit names of the other circuit information may be used. The other circuit information indicated by the reference identifiers can also be partially or wholly formed with other circuit information. Circuit information at the lowest layer contains no reference identifier in the circuit data.

The editing part, when part of circuit information specified in specification information is formed with other circuit information, obtains the specified circuit information and other circuit information indicated by a reference identifier contained in it from the memory part and links them, and generates the specified circuit information. If all of the specified circuit information is formed with other circuit information, the editing part obtains all pieces of other circuit information indicated by reference identifiers from the memory part to link them and generates the specified circuit information.

In this case, the editing part obtains a reference identifier of specified circuit information from the memory part or from specified circuit information, obtained from the memory part. In the case of the third invention, either of them is possible.

A fourth invention relates to a method for the editing part to obtain a reference identifier of specified circuit information. In the fourth invention, the editing part makes an inquiry about circuit information to the memory part by an identifier of circuit information indicated by specification information passed from the acquisition part. On receiving the identifier of circuit information from the editing part, the memory part returns the circuit information to the editing part, and if the circuit information indicated by the identifier contains a reference identifier, returns the reference identifier to the editing part.

The editing part sends the received reference identifier to the memory part again. The memory part returns circuit information indicated by the reference identifier to the editing part, and if the circuit information further contains a reference identifier, returns the reference identifier to the editing part.

On further receiving a reference identifier, the editing part repeats the above operations and obtains from the memory part all circuit information necessary to generate circuit information of a specified circuit.

The fifth invention relates to a data structure of circuit information stored in the memory part. Use of the data structure allows quick exchange of an identifier of the circuit information and the circuit information between the editing part and the memory part.

In other words, circuit information comprises a circuit data unit and an additional information unit thereof. The additional information unit contains an identifier of its own circuit information, and in the case where part or all of the circuit information is formed with other circuit information, contains an identifiers of the other circuit information as reference identifiers. The circuit data unit is for forming circuits in the programmable logic circuits, and in the case where part or all of the circuit information is formed with other circuit information, circuit data of the part or all of the circuit information is described using the reference identifiers.

In response to an inquiry by an identifier of circuit information from the editing part, the memory part returns to the editing part a reference identifier contained in the additional information unit of circuit information indicated by the identifier. The editing part sends the reference identifier obtained from the memory part to the memory part to make an inquiry about circuit information again, and obtains from the memory part circuit information indicated by the reference identifier.

According to the fifth invention, the editing part need not analyze circuit information to find out a reference identifier of other circuit information forming specified circuit information and can therefore quickly obtain necessary circuit information from the memory part.

According to the sixth invention, the circuit data unit of circuit information is described by pairs of the address of a configuration memory of programmable logic circuits and circuit data stored in the address, and in the case where part or all of the circuit information is formed with other circuit information, the reference identifiers are described as circuit data of addresses corresponding to positions where the other circuit information is referenced in the circuit information.

Accordingly, the editing part, by allocating circuit information indicated by the reference identifier according to data contents of the circuit data unit, can quickly assemble circuit information of a circuit specified by specification information.

The seventh invention relates to a concrete method for linking circuit information indicated by a reference identifier in the editing part to circuit information indicated by specification information. According to the seventh invention, the address at which a reference identifier of the circuit data unit of circuit information is contained is added to all the addresses of the circuit data unit of other circuit information corresponding to the reference identifier to link the other circuit information to the circuit information in which the reference identifier is contained.

As described above, according to the seventh invention, simply by adding offset to addresses, circuit information indicated by a reference identifier can be linked to circuit information in which the reference identifier is contained, so that little time is required for computations on layout and wirings. Therefore, the editing part can generate circuit information in a short time.

DESCRIPTION OF THE PREFERRED EMBODIMENTS

Hereinafter, a description will be made of the preferred embodiments of an information processing system, a circuit information management method, and a circuit information storage device according to the present invention with reference to the accompanying drawings.

[First embodiment]
[Outline of the Configuration of An Overall Information Processing System]

Figure 1:
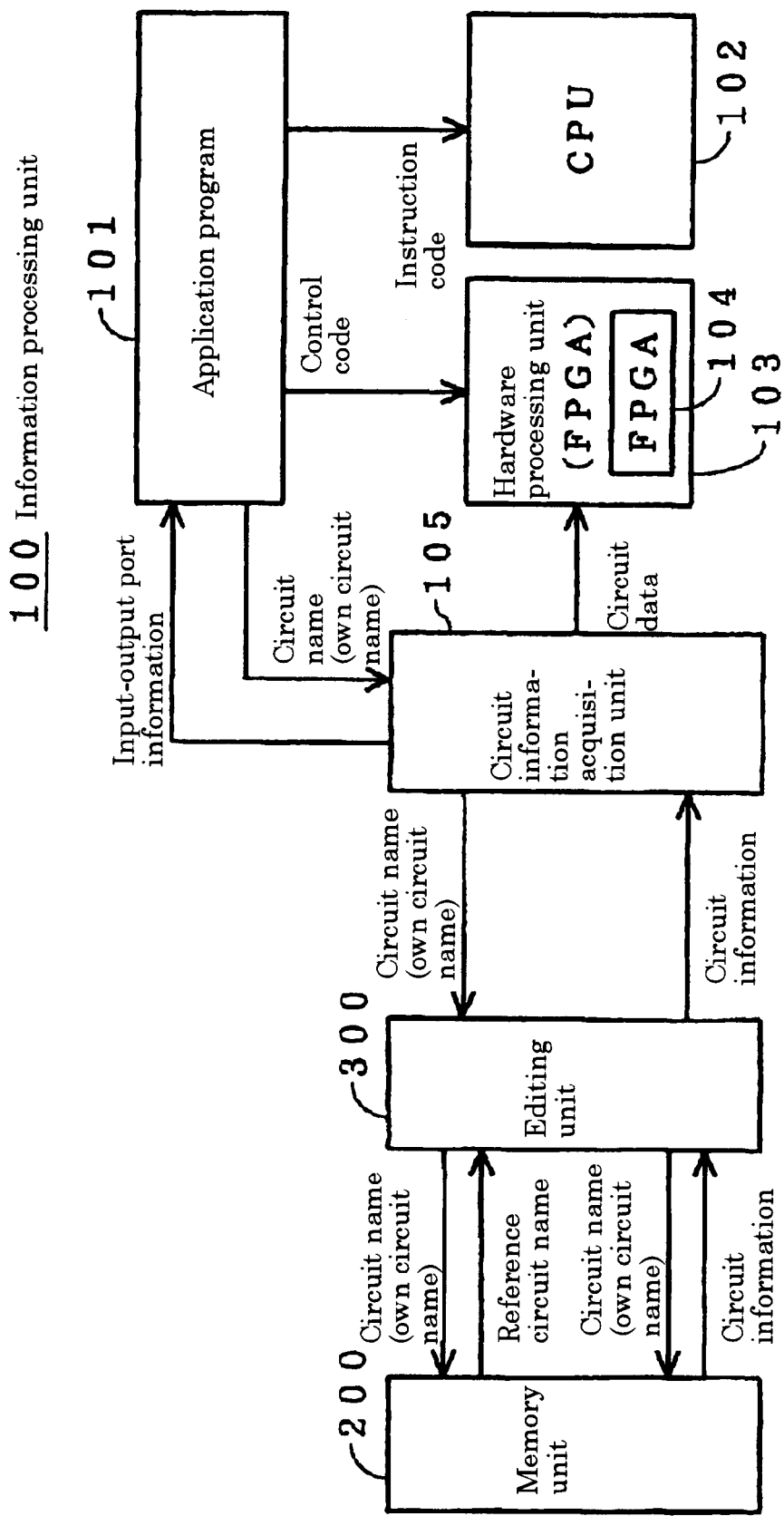
FIG. 1 is a block diagram showing an overall outline of an embodiment of an information processing system according to the present invention.

FIG. 1 shows a principal conceptual configuration of a first embodiment of an information processing system according to the present invention in which at least part of processing is performed in a processing part that holds reconfigurable programmable logic circuits.

In this case, the information processing system comprises an information processing unit 100, a memory unit 200, and an editing unit 300. The information processing unit 100, memory unit 200, and editing unit 300 can be formed within one information processing apparatus, or may also be connected together as separate apparatuses over a network.

Alternatively, an information processing system may also be formed by constituting the memory unit 200 and the editing unit 300 by one computer system and connecting it over a network to the information processing unit 100 comprising a computer system.

Examples described below assume that the information processing unit 100, the memory unit 200, and the editing unit 300 are connected together over a network as separate devices.

In the information processing unit 100, the application program 101 splits a series of processes to execute into a plurality of processes and executes the split processes in the CPU 102 or the hardware processing unit 103 holding programmable logic circuits. In the application program 101, processing performed in the CPU 102 is described in instruction codes of the CPU 102, and processing performed in the hardware processing unit 103 is described with the names of circuits formed in the programmable logic circuits 104 thereof and control codes of the hardware processing unit 103 containing the circuits as components.

The hardware processing unit 103, which constitutes the processing part, has the programmable logic circuits 104 of FPGA type in this example and performs processing using circuits formed in the programmable logic circuits 104.

The circuit information acquisition unit 105 constituting the acquisition part receives a request from an application program 101 for circuits to be formed in the programmable logic circuits 104 of the hardware processing unit 103, makes a request to the editing unit 300 for circuit information for forming the circuits, and obtains the requested circuit information from the editing unit 300. As will be described later, the circuit information comprises a header unit and a code unit (circuit data unit).

The circuit information acquisition unit 105 loads circuit data contained in the code unit of obtained circuit information into the hardware processing unit 103 to form circuits in the programmable logic circuits thereof. Furthermore, the circuit information acquisition unit 105 offers input-output port information contained in the header unit of circuit information to the application program 101.

The application program 101, based on input-output port information from the circuit information acquisition unit 105, inputs or outputs data from or to circuits formed in the programmable logic circuits 104 of the hardware processing unit 103.

The memory unit 200 stores a plurality of pieces of circuit information for forming the circuits of the programmable logic circuits 104. As will be described later, in this case, the circuit information is structured so that it can be stored in the memory unit 200 with a so-called tree data structure which allows the circuit information to be described by referencing other circuit information, whereby circuit information resources generated previously can be effectively used and the storage capacity of storage elements of the memory unit 200 is reduced.

Although the memory unit 200, in the case of this example, is provided in a computer system on a network connected to the information processing unit 100 as will be described later, it may also be provided within a computer system united with the information processing unit 100.

The editing unit 300 obtains circuit information necessary to generate circuit information of a circuit requested from the circuit information acquisition unit 105 of the information processing unit 100 from the memory unit 200. The editing unit 300 edits the obtained circuit information as required to generate circuit information of circuit to be re-formed in the programmable logic circuits 104, and offers it to the circuit information acquisition unit 105.

As will be described in detail later, since circuit information is structured to permit reference to other circuit information, the editing unit 300 performs reference solution processing to solve reference relations by making an inquiry about requested circuit information to the memory unit 200, and relocation processing to edit the circuit information based on the results of the reference solution processing.

Although the editing unit 300, in the case of this example, is provided in a computer system on a network connected to the information processing unit 100 as will be described later, it may also be provided within a computer system united with the information processing unit 100.

[Structure of Circuit Information Stored in the Memory Unit 200]

Figure 2:
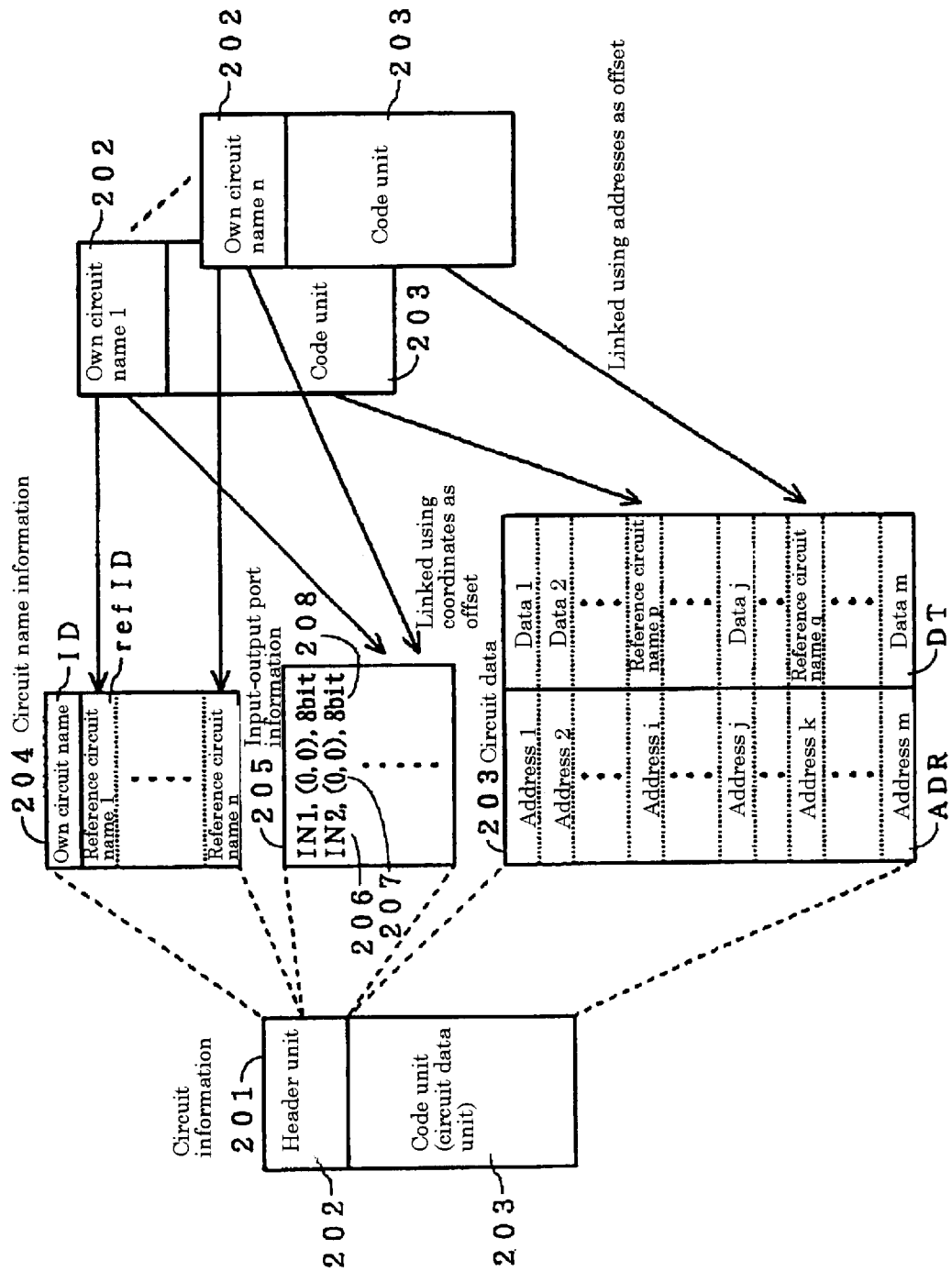
FIG. 2 is a diagram illustrating an embodiment of a circuit information management method according to the present invention.

Circuit information 201 stored in the memory unit 200, as shown in FIG. 2, consists of a header unit 202 as an additional information unit and a code unit 203 as a circuit data unit. The header unit 202 contains circuit name information 204 and input-output port information 205.

The circuit name information 204, as an identifier ID of its own circuit information, in this example, contains the name (hereinafter called an own circuit name) of a circuit to be formed in the programmable logic circuits 104 by the circuit information 201. The own circuit name as an identifier ID of its own circuit information is also a name assigned to the circuit information 201. In this example, the application program 101, as will be described later, uses the own circuit name serving as an identifier ID of the circuit information as specification information of circuit to be formed in the programmable logic circuits 104.

In addition to the own circuit name, the circuit name information 204 of the header unit 202, as a reference identifier refID for identifying other circuit information referenced by the circuit information 201, also contains a circuit name (hereinafter called a reference circuit name) of the referenced circuit information. Only one own circuit name is contained in the header unit 202 as an identifier ID of own circuit information, while as many reference circuit names as there are pieces of circuit information referenced may be contained in the header unit 202.

Input-output port information 205 of the header unit 202 follows the circuit name information 204. The input-output port information 205 consists of port coordinates (X,Y) 207 and port data width (bit count) 208 in a unit of port type 206 or logic cell (to be described later) selected from input (IN), output (OUT), or bidirectional (IN/OUT) depending on the direction of the flow of signal in a circuit.

The code unit 203 consists of a collection of pairs of address ADR and data DT. An address ADR is the address of configuration memory (to be described later) that determines the status of logic cells and wirings constituting the programmable logic circuits 104. Data DT determines the status of logic cell and wiring corresponding to an address written to configuration memory.

The code unit 203 of each piece of circuit information 201 stored in the memory unit 200 begins at a specific address (e.g., 0x0000, etc. for 16-bit addresses: 0x denotes hexadecimal notation. This is also the same for the following). As will be described later, by adding a given value as offset to the address, the address of the code unit is converted to an address corresponding to the position of a circuit actually formed on the programmable logic circuits 104 of the hardware processing unit 103.

When a reference circuit name is contained in circuit name information 204 of the header unit 202, reference circuit information for deciding how circuit information indicated by the reference circuit name is linked to a circuit formed by circuit information in which the reference circuit name is contained is contained in the code unit 203.

The reference circuit information is contained in the code unit of circuit information of reference source as pairs of an address (referred to as a reference address) and a reference circuit name. Examples are a pair of address i and reference circuit name p and a pair of address k and reference circuit name q in FIG. 2. As will be described later, the editing unit 300 obtains circuit data by adding a reference address of the reference circuit information, as offset, to the start address of the code unit of circuit information referenced by a reference circuit name and links the obtained circuit data to the code unit of circuit information of reference source, thereby linking the reference circuit to the reference source circuit.

As will be described later, since there is a certain relationship between addresses ADR and logic cells, the editing unit 300 calculates offset coordinates of input-output port position of a reference circuit from a reference address, obtains input-output port information of the reference circuit by adding the offset coordinates to the input-output port coordinates of the reference circuit, and thus links the obtained input-output port information to the header unit of circuit information of the reference source circuit.

Circuit information not using other circuit information has no reference circuit name in the header unit 202. A minimum unit of circuit information such as basic circuit modules has no reference circuit name in the header unit 202. Other circuit information referenced by a reference circuit name may have a reference circuit name in the header unit 202. For a tree structure of such a multilayer structure, the editing unit 300 links circuit information sequentially from the lowest layer of circuit information to generate circuit information of a circuit name specified from the acquisition unit 105.

[Hardware Configuration of An Information Processing System]

Figure 3:
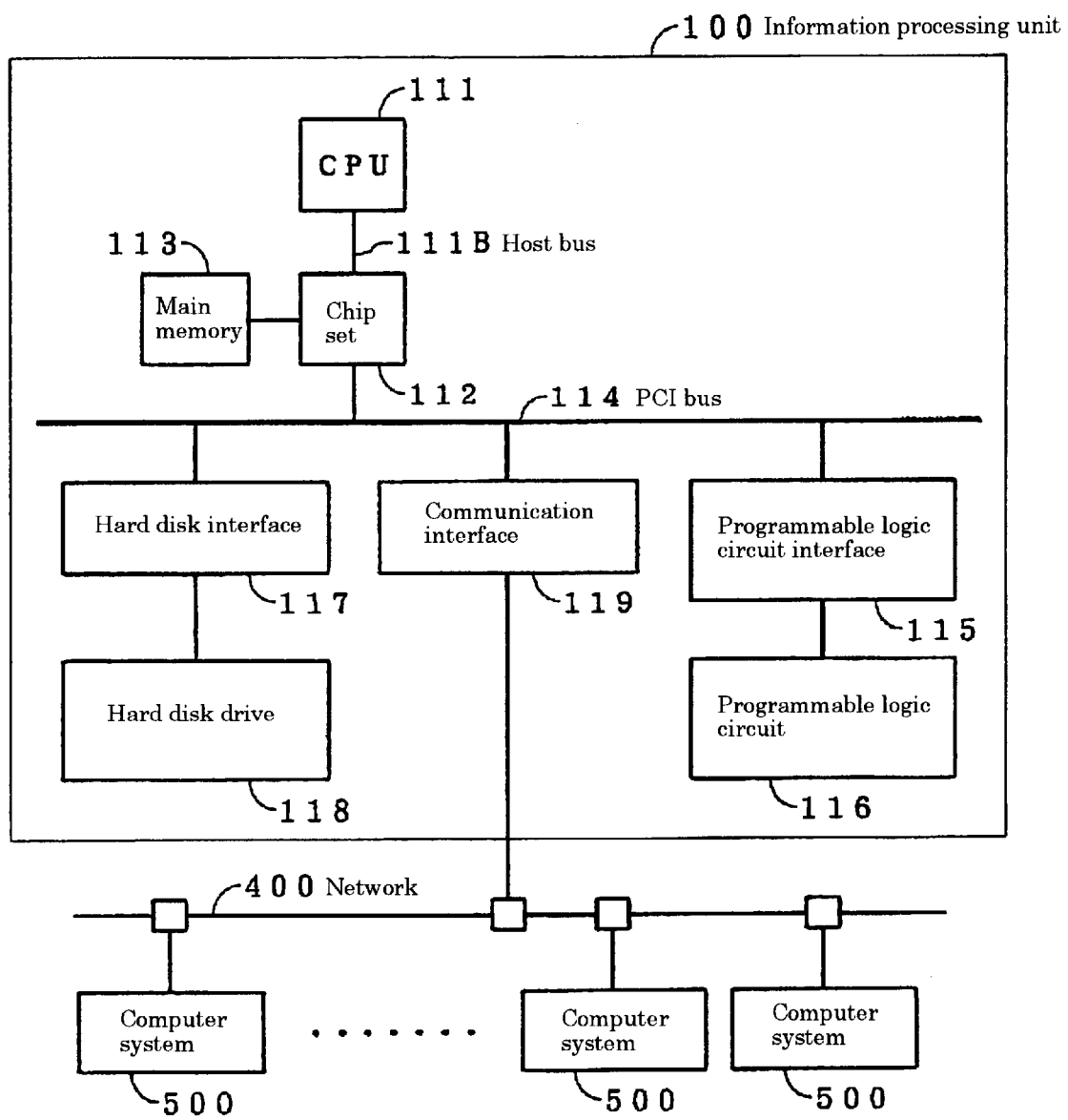
FIG. 3 is a hardware configuration diagram of an embodiment of an information processing system according to the present invention.

FIG. 3 is a block diagram showing a hardware configuration example of an information processing system of the embodiment. In the information processing system of the embodiment, the information processing unit 100 has main memory comprising, e.g., DRAM connected to a host bus 111B of the CPU 111 through a memory controller (not shown) contained in a chip set 112.

The host bus 111B is connected to a PCI bus 114 through a host-PCI bus bridge (not shown) contained in the chip set 112. To the PCI bus 114, programmable logic circuits 116 are connected through a programmable logic circuit interface 115, a hard disk drive 118 through a hard disk interface 117, and a communication interface 119. The programmable logic circuits 116 correspond to the programmable logic circuits 104 of the hardware processing unit 103 in FIG. 1.

The communication interface 119 is connected to a plurality of computer systems 500 through a network 400 such as LAN and Internet. A computer system 500 holds at least a CPU (not shown), a main memory (not shown), and storage devices such as hard disk drive (not shown).

In a hard disk read and written by the hard disk drive 118, an application program (not shown) is stored. The application program, through the hard disk interface 117, the PCI bus 114, and the host-PCI bridge (not shown) contained in the chip set 112, is loaded from the hard disk drive 118 into the main memory 113 and is executed by the CPU 111.

The application program may be stored in a storage device (not shown) of one of computer systems 500 connected to the network 400. In this case, the information processing unit 100 loads the application program into the main memory 113 for execution from the computer system 500 connected to the network 400 through the communication interface 119.

A storage device (not shown) of a computer system 500 connected to the network 400 stores circuit information, constituting the memory unit 200 in FIG. 1. In some cases, the hard disk drive 118 of the information processing unit 100 may store circuit information, constituting the memory unit 200 in FIG. 1.

Functions that allow a computer system 500 to retrieve circuit information stored in the memory unit 200 in FIG. 1 and transfer it to the computer systems 500 through the network 400 are implemented like a software module as one of functions of the computer systems 500.

The editing unit 300 in FIG. 1 is implemented like a software module as one of functions of a computer system 500 connected to the network 400. A computer system 500 constituting the editing unit 300 in FIG. 1 and a computer system 500 constituting the memory unit 200 in FIG. 1 may be the same computer system or different computer systems.

If a computer system 500 constituting the editing unit 300 in FIG. 1 and a computer system 500 constituting the memory unit 200 in FIG. 1 are different computer systems, they communicate with each other through the network 400.

The circuit information acquisition unit 105 in FIG. 1 of the information processing unit 100 is implemented in the information processing unit 100 like a software module having the following functions: carrying out communication with the editing unit 300 constituted with a computer system connected to the network 400 through the communication interface 119 and loading circuit data into the programmable logic circuits 116 through the programmable logic circuit interface 115 connected to the PCI bus 114.

As described above, since the circuit information acquisition unit 105 is implemented in the information processing unit 100 like a software module, it can communicate with the application program executed in the information processing unit 100.

The hardware processing unit 103 in FIG. 1 comprises the programmable logic circuit interface 115 and the programmable logic circuits 116. The hardware processing unit 103 has a function to communicate with an application program executed in the CPU 111 through the programmable logic circuit interface 115 connected to the PCI bus 114.

[Programmable Logic Circuit of FPGA Type]

Figure 4:
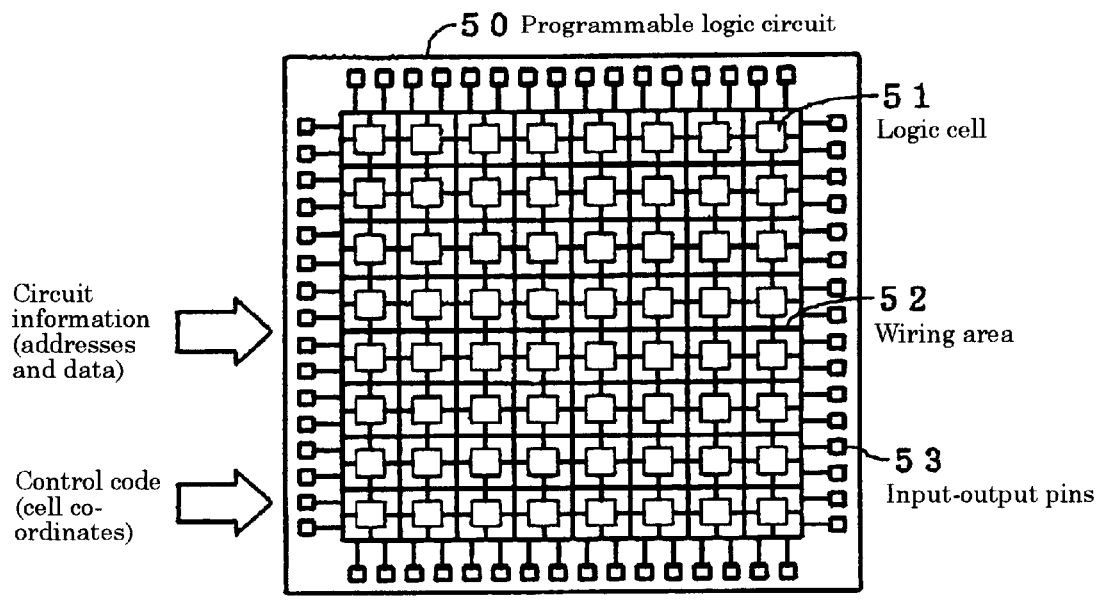
FIG. 4 is a diagram illustrating a programmable logic circuit of FPGA type.
Figure 5:
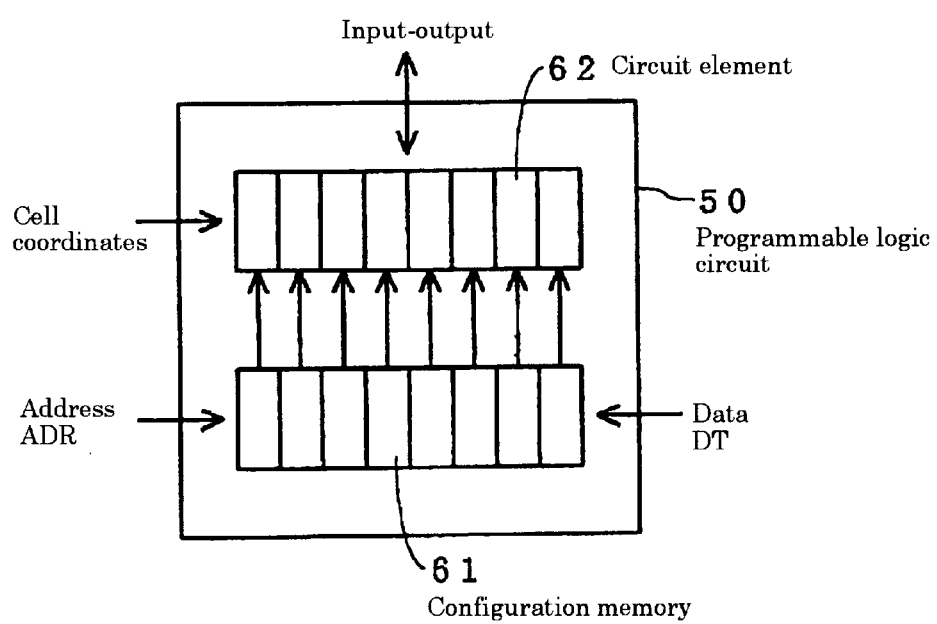
FIG. 5 is a diagram illustrating a programmable logic circuit of FPGA type.

As described previously, in the embodiment, programmable logic circuits of FPGA type are used as the programmable logic circuits 116 (the programmable logic circuits 104 in FIG. 1). The plane structure of a programmable logic circuit 50 of the FPGA type is shown in FIG. 4 and a block diagram of an internal structure thereof is shown in FIG. 5.

The programmable logic circuit 50 comprises configuration memory 61 for storing circuit information, circuit elements 62 comprising logic cells 51 and a wiring area 52, and input-output pins 53.

The configuration memory 61 comprises erasable memory devices such as EEPROM and SRAM. Circuit data consists of pairs of address ADR and data DT. When an address ADR is afforded to the configuration memory 61 and data DT paired with the address ADR is stored in a memory cell corresponding to the address ADR, in accordance with the data DT, the circuit makeup of the logic cells 51 and the connection state of the wiring area 52 to interconnect the logic cells 51 with input-output pins 53 are changed. By modifying part of the configuration memory 61, the programmable logic circuit 50 can be partially re-formed even when the circuit is busy.

Data to be processed is inputted to the circuit elements 62 re-formed in the programmable logic circuits 50 through the input-output pins 53 and processing results are outputted. A logical cell to which the data is inputted and a logical cell from which the data is outputted are specified by an application program (application program 101 in the example of FIG. 1) using control code containing cell coordinates corresponding to the positions of the logic cells.

[Operation in An Information Processing System]

The operation of an information processing system configured as described above will be described using a configuration diagram in FIG. 1, and flowcharts shown in FIGS. 6, 7, and 8.

The application program 101 started in an information processing apparatus (not shown) performs a series of processes in the CPU 102 or the programmable logic circuits 104 of the hardware processing unit 103. The application program 101 directs the CPU 102 for processing in the same procedure as in processing by use of normal computers.

The following description relates to the case where circuits required for the application program to perform processing are formed in the programmable logic circuits 104. That is, an information processing system generates circuit information of circuit to be formed in the programmable logic circuits 104, and based on the circuit information, forms the circuit in the programmable logic circuits 104 of the hardware processing unit 103, and performs processing using the formed circuit.

(Circuit Information Request)

Figure 6:
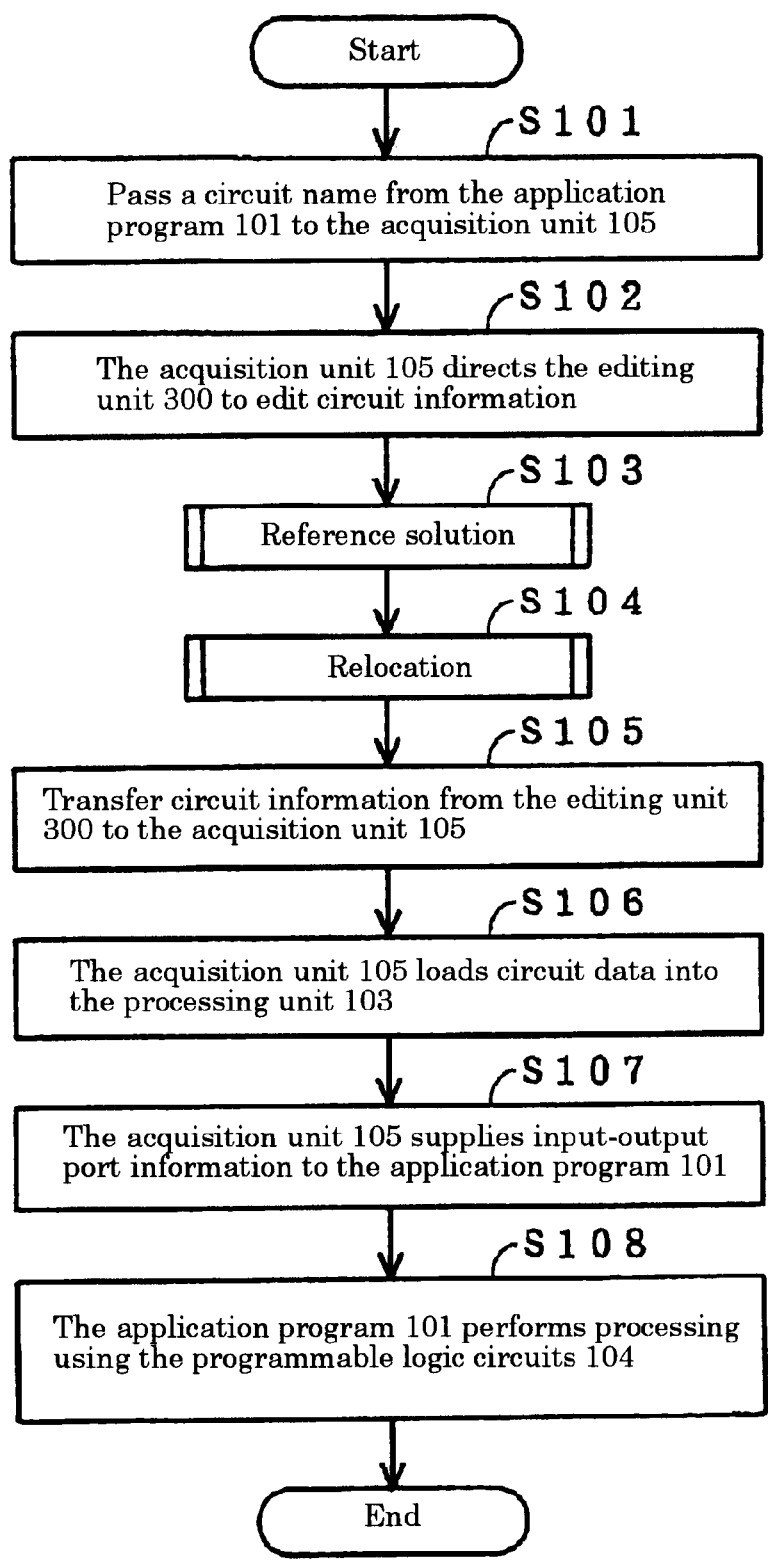
FIG. 6 is a flowchart showing a detailed processing procedure of an embodiment of an information processing system according to the present invention.

As shown in the flowchart in FIG. 6, the application program 101 started in an information processing apparatus (not shown) makes a request to the acquisition part for specification information of a circuit required for processing performed in the hardware processing unit 103 (step S101). In this example, the name (own circuit name) of that circuit is used as the specification information of the circuit.

On receiving a circuit name as specification information of a circuit from the application program, the circuit information acquisition unit 105 passes the circuit name to the editing unit 300 and directs the editing unit 300 to edit the circuit information so that circuits required by the hardware processing unit 103 can be formed (step S102).

(Reference Solution Processing)

The editing unit 300 passes the circuit name received from the acquisition unit 105 to the memory unit 200 for inquiry to obtain circuit information of the circuit name. However, as described above, in the case of this example, since circuit information specified by the circuit name may reference other circuit information, reference solution processing is performed to know the reference circuit name (step S103).

The procedure of the reference solution processing will be described with reference to the flowcharts in FIGS. 7A and 7B. FIG. 7A is a flowchart of processing performed in the editing unit 300 as the reference solution processing and FIG. 7B is a flowchart of processing performed in the memory unit 200 as the reference solution processing.

As shown in FIG. 7A, the editing unit 300 inquires of the memory unit 200 about the circuit name obtained from the acquisition unit 105 (step S111).

As shown in FIG. 7B, on detecting an inquiry about the circuit name from the editing unit 300 (step S121), the memory unit 200 obtains the circuit name (step S122), consults the header unit 202 of circuit information 201 corresponding to the circuit name, and determines the existence of a reference circuit from whether a reference circuit name is described (step S123). If a reference circuit name is described, a reference circuit name contained in the header unit 202 is returned to the editing unit 300 (step S124).

The editing unit 300 determines whether the circuit name inquired of the memory unit 200 has a reference circuit name from whether a reference circuit name is returned from the memory unit 200 (step S112), and if a reference circuit name is returned, obtains it and temporarily holds it (step S113).

To know a reference circuit name further referenced by a circuit corresponding to the reference circuit name received from the memory unit 200, the editing unit 300 inquires of the memory unit 200 again about the received reference circuit name (steps S114 and S111).

On detecting further inquiry about a circuit name by the reference circuit name from the editing unit 300 (step S125), the memory unit 200 repeats step S122 and following steps, and if circuit information of the reference circuit name contains a reference circuit, returns the reference circuit name again. The editing unit 300 obtains and holds the reference circuit name in step S113.

The editing unit 300 repeats step S112 and following steps as described above until there is no reference circuit for any circuit names received from the acquisition unit 105 and the memory unit 200, and terminates the reference solution processing when all reference circuit names referenced by circuits are obtained. Likewise, the memory unit 200 terminates the reference solution processing when there is no inquiry about circuit names from the editing unit 300.

In this way, the editing unit 300 can obtain all circuit names required to form the circuit of the circuit name which the circuit information acquisition unit 105 requested of the editing unit 300.

(Relocation Processing)

Next, as shown in FIG. 6, the editing unit 300 links circuit information corresponding to circuit names obtained in the above-mentioned reference solution processing and performs relocation to generate circuit information of the circuit name which the circuit information acquisition unit 105 requested of the editing unit 300 (step S104). FIG. 8 shows the procedure of relocation processing.

The editing unit 300 requests of the memory unit 200 the circuit information of the circuit (reference source circuit) received from the circuit information acquisition unit 105 and circuit information of reference circuits referenced by the reference source circuit (step S131). The memory unit 200 offers circuit information of requested circuit names to the editing unit 300 (step S132). Circuit information of the reference source circuit may also be obtained from the memory unit 200 at the inquiry about the first circuit name for reference solution.

The editing unit 300 adds as offset the reference address of the reference source circuit to the address of circuit data of a received reference circuit to link the circuit data to the code unit of circuit information of the reference source (step S133). This processing will be described in detail later using a concrete example. The editing unit 300 calculates the offset cell coordinates of input-output port position of the reference circuit from the reference address and adds the offset cell coordinates to the input-output position coordinates of the reference circuit, thereby linking the input-output port information of the reference circuit to the header unit of circuit information of the reference source circuit (step S134). A concrete example of this processing will also be described in detail later.

The editing unit 300 repeats the above-mentioned procedure for all circuit names (step S135).

Upon termination of the relocation processing, as shown in FIG. 6, the editing unit 300 offers generated circuit information to the circuit information acquisition unit 105 (step S105).

(Load)

The circuit information acquisition unit 105 loads circuit data contained in the code unit of circuit information obtained from the editing unit 300 into the hardware processing unit 103, re-forms circuits in the programmable logic circuits 104 (step S106), and offers input-output information contained in the header unit to the application program 101 (step S107).

(Processing By Application)

The hardware processing unit 103, according to control codes from the application program 101 based on input-output port information, inputs or outputs data from or to circuits re-formed in the programmable logic circuits 104 such that information processing is performed using the circuits re-formed in the programmable logic circuits 104 (step S108).

[Embodiment of Processing By An Information Processing System: Sharpness Processing]

Next, a description will be made of a more detailed embodiment that applies the information processing system of the first embodiment to image processing. In this embodiment, sharpness processing is described which sharpens an unclear image by performing three types of processing for image data, namely gradation conversion processing, noise elimination processing, and edge detection processing, by using three types of image filters described below. First, the image filters will be described.

[Filters]

Space filter processing, a sort of image processing, performs operations on a single pixel or a plurality of pixels of an image filter comprised of unit pixel. This can be represented by the following expression (1), which finds a pixel value $x_{l,m}$ by the product of the sum of results obtained by multiplying pixels (data $p_{l,m}$) in the neighborhood of a pixel (data $x_{l,m}$) by mask data filter$_{l,m}$ and a coefficient N. The space filter permits various processing by changing the mask data filter$_{l,m}$ and the value of the coefficient N in the expression.

[Expression 1]

$$x_{l,m} = N \sum_{l-1}^{l+1} \sum_{m-1}^{m+1} p_{l,m} \times filter_{l,m} \qquad (1)$$

(Noise Elimination Gaussian Filter)

Figure 9:
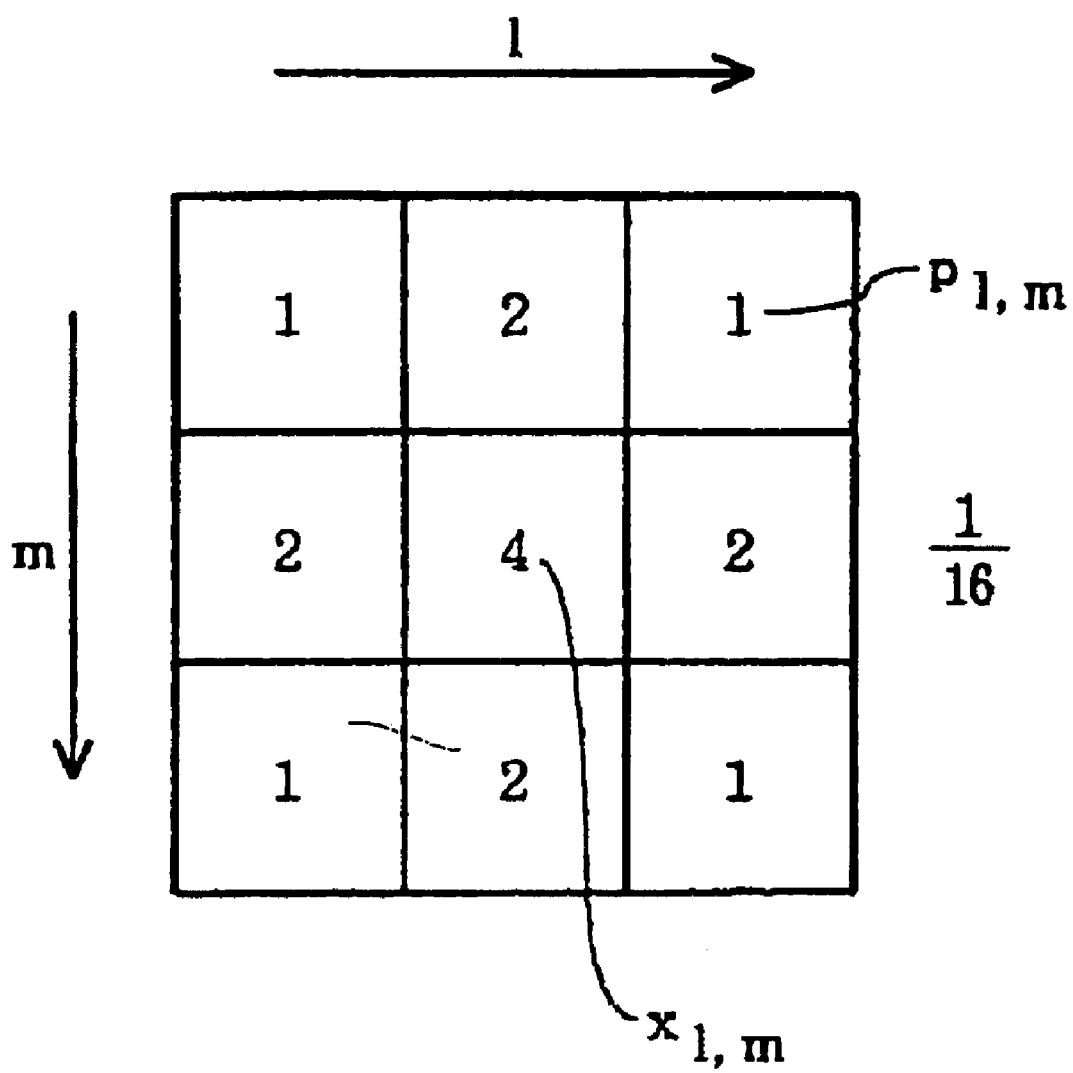
FIG. 9 is a diagram illustrating an example of concrete processing used in an embodiment of an information processing system according to the present invention.

FIG. 9 is an example of mask data of image filter called Gaussian filter for eliminating noise by subjecting an image to Gaussian distribution smoothing processing. Data $x_{l,m}$ of a central pixel is replaced by the product of the sum of results obtained by multiplying the data of the central pixel and data $P_{l,m}$ of eight pixels within three-by-three pixels in the neighborhood thereof by mask data coefficients filter$_{l,m}$, and a coefficient N (=1/16). This filter processing makes it possible to eliminate noise from the image.

Figure 10:
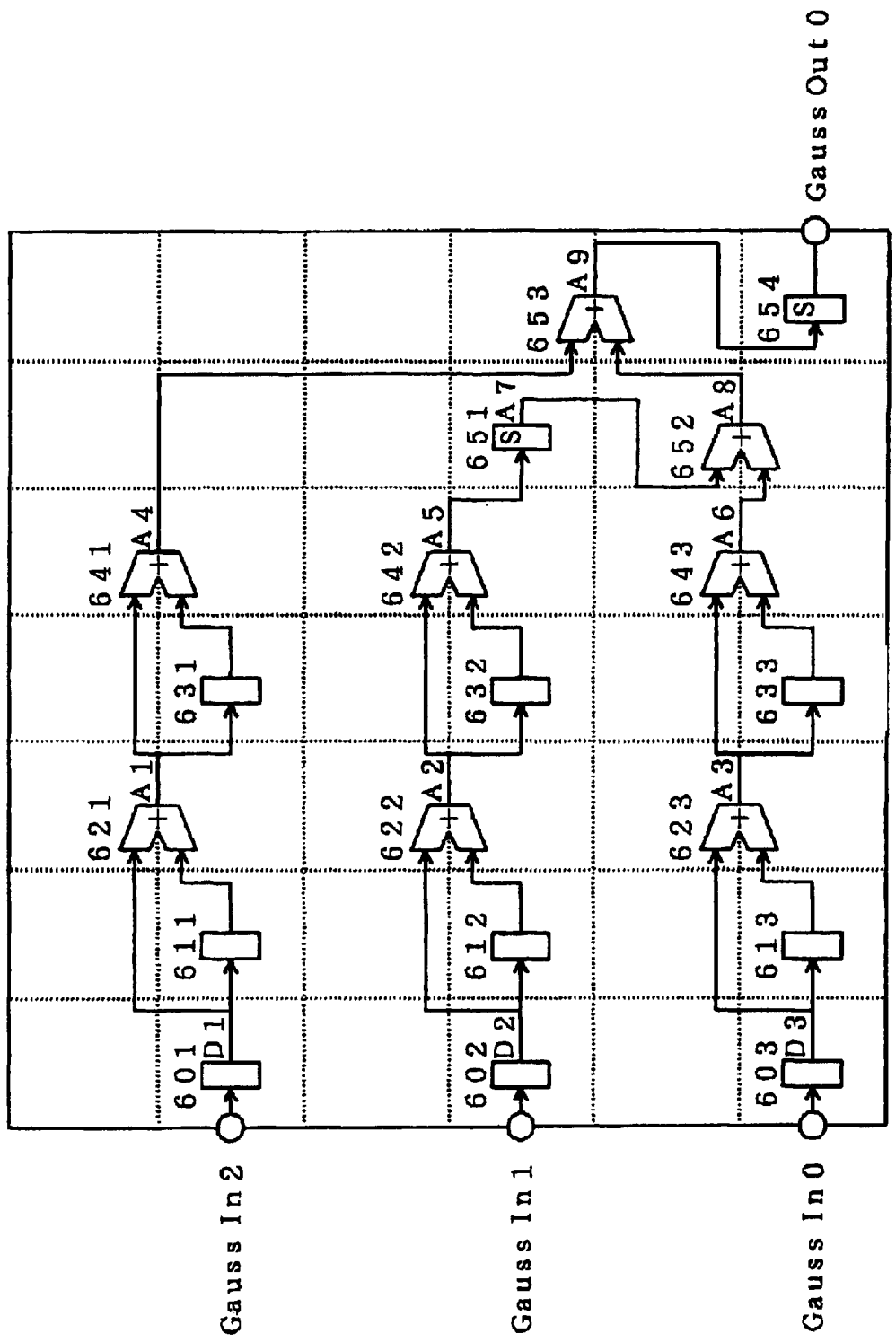
FIG. 10 is an example of a circuit formed in a programmable logic circuit.

FIG. 10 shows an example of the configuration of a circuit (circuit name Gauss) to implement Gaussian filter processing in FIG. 9. Grids shown in dashed lines in the figure are logic cells of the programmable logic circuit. In this embodiment, image data, each piece of which consists of eight bits per pixel, is processed. A logic cell of the programmable logic circuit used has an eight-bit signal line for both input and output. Accordingly, an eight-bit register described below is implemented by a single logic cell and an eight-bit two-input adder is implemented by two logic cells.

In FIG. 10, data p[1−1][m−1], p[1][m−1], and p[1+1][m−1] of three pixels in a mask area to be subjected to filter processing are transferred from an original image file to the circuit, as data consisting of eight bits per pixel.

The transferred data of three pixels is inputted to the input ports Gauss In0, Gauss In1, and Gauss In2 of the circuit, respectively and, at the first clock, to registers 601, 602, and 603. The inputted pieces of data are designated as register outputs D1, D2, and D3, which are inputted to the registers 611, 612, and 613, and the adders 621, 622, and 623, respectively.

At the next clock, three pixels p[1−1][m], p[1][m], and p[1+1][m] of data appear at the outputs D1, D2, and D3 in the same way. At this time, the outputs A1, A2, and A3 of the adders 621, 622, and 623 are represented respectively as shown below.

A1=p[1−1][m−1]+p[1−1][m]
A2=p[1][m−1]+p[1][m]
A3=p[1+1][m−1]+p[1+1][m]

The outputs of the adders 621, 622, and 623 are inputted to registers 631, 632, and 633, and adders 641, 642, and 643 at the same time.

At the next clock, data of three pixels p[1−1][m+1], p[1][m+1], and p[1+1][m+1] appears at the outputs D1, D2, and D3 in the same way.

At this time, the outputs A1, A2, and A3 of the adders 621, 622, and 623 are represented respectively as shown below.

A1=p[1−1][m]+p[1−1][m+1]
A2=p[1][m]+p[1][m+1]
A3=p[1+1][m]+p[1+1][m+1]

The outputs A4, A5, and A6 of the adders 641, 642, and 643 become as shown below respectively:

A4=p[1−1][m−1]+p[1−1][m]×2+p[1−1][m+1]

A5=p[1][m−1]+p[1][m]×2+p[1][m+1]

A6=p[1+1][m−1]+p[1+1][m]−2+p[1+1][m+1]

The shifter 651 shifts the output A5 of the adder 642 upward one bit position and always inputs 0 to the least significant bit, whereby the output A5 of the adder 642 is doubled as the output A7 of the shifter 651.

Next, the sum total of the outputs A4 and A6 of the adders 641 and 643 and the output A7 of the shifter 651 is found by the adders 652 and 653. The shifter 654 shifts the output A9 of the adder 653 downward four bit position so that the fifth bit is the least significant bit, whereby a ¹⁄₁₆ operation is performed and the result is outputted to an output port GaussOut0. This terminates Gaussian filter processing in unit mask area. By subsequently repeating the processing, the entire image is processed.

(Edge Detection Laplacian Filter)

Figure 11:
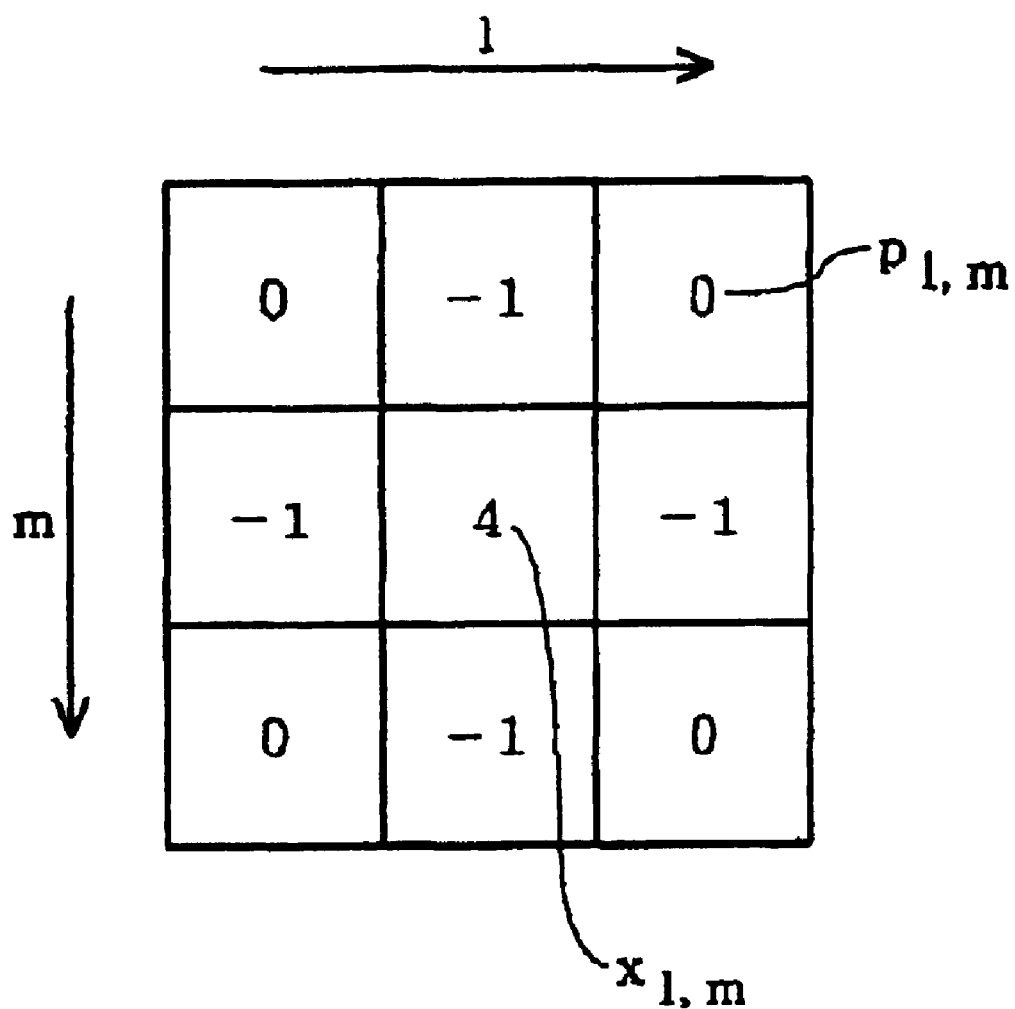
FIG. 11 is a diagram illustrating an example of concrete processing used in an embodiment of an information processing system according to the present invention.

FIG. 11 shows an example of mask data of an image filter called a Laplacian filter for detecting edges by quadratic differential. The contours of image can be detected by performing the filter processing.

Figure 12:
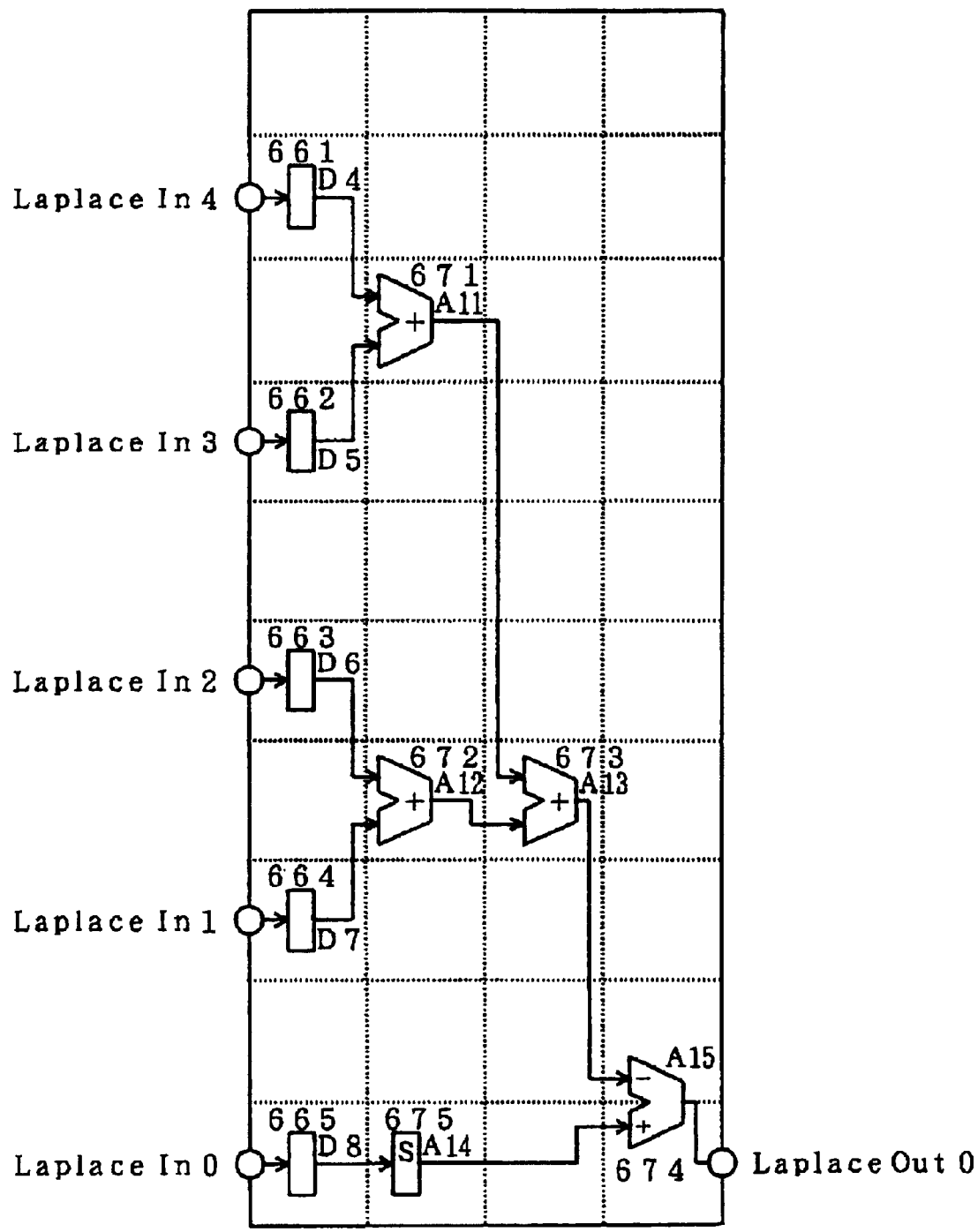
FIG. 12 is a diagram illustrating an example of a circuit formed in a programmable logic circuit.

FIG. 12 shows an example of the configuration of a circuit (circuit name Laplace) to perform Laplacian filter processing. Data p[1][m], p[1−1][m], p[1][m−1], p[1][m+1], and p[1+1][m] of five pixels in a mask area to be subjected to filter processing is transferred from the original image file to the circuit as eight-bit data per pixel.

The transferred data of five pixels is inputted to circuit's input ports LaplaceIn0, LaplaceIn1, LaplaceIn2, LaplaceIn3, and LaplaceIn4, respectively, and at the first clock to registers 661, 662, 663, 664, and 665. The inputted data is designated as D4, D5, D6, D7, and D8, and the outputs D4 and D5 are inputted to an adder 671 and the outputs D6 and D7 are inputted to an adder 672. The output A13 of the adder 673 becomes as follows by an operation by the adders 671, 672, and 673:

A13=p[1−1][m]+p[1][m−1]+p[1][m+1]+p[1+1][m]

On the other hand, the shifter 675 shifts the output D8 of register 665 upward two bit position and always inputs 0 to the lower two bits, whereby the output A14 of the shifter 675 becomes as follows:

A14=4×p[1][m]

The output A13 of the adder 673 is subtracted from the output A14 of the shifter 675 by a subtracter 674, and the output A15 of the subtracter becomes as follows:

A15=4×p[1][m]−(p[1−1][m]+p[1][m−1]+p[1][m+1]+p[1+1][m]). The result is outputted to an output port LaplaceOut0. This terminates Laplacian filter processing in a unit mask area. By subsequently repeating the processing, the entire image is processed.

(Gradation Conversion)

Figure 13:
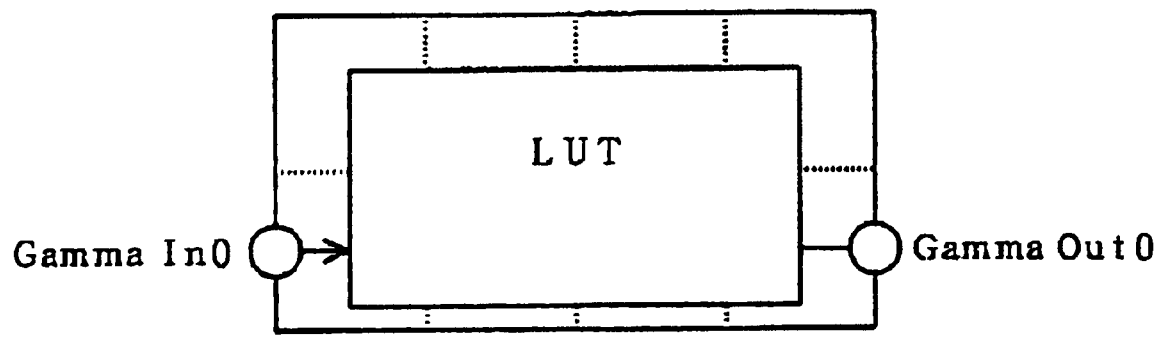
FIG. 13 is a diagram illustrating an example of concrete processing used in an embodiment of an information processing system according to the present invention.

FIG. 13 shows an example of a circuit (circuit name Gamma) to implement a filter for subjecting a single pixel of an image to gradation conversion. For example, by performing gamma conversion on an input-output relationship shown in a graph of FIG. 14, contrast can be corrected by converting a depth distribution of image.

Figure 14:
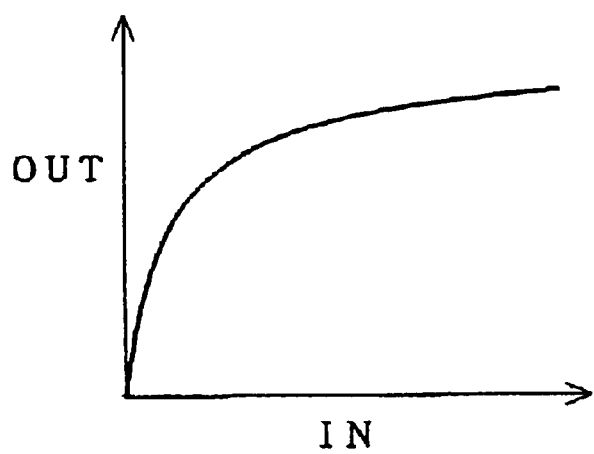
FIG. 14 is a diagram illustrating an example of concrete processing used in an embodiment of an information processing system according to the present invention.

This example uses the lookup table (LUT) method. That is, a lookup table LUT is referenced for an input port GammaIn0 and a value corresponding to a value shown in the graph of FIG. 14 is outputted to an output port GammaOut0.

The lookup table LUT can be implemented by setting table data in advance in memory circuits such as SRAM and ROM. It can also be implemented by creating an input-output truth table conforming to the graph of FIG. 14 and forming a circuit with logic gates such as AND, OR, and exclusive-OR gates.

The gradation conversion is performed in such a way that pixel data p[1][m] is sequentially transferred to a circuit as input data, and output data for the input data is outputted obtained by referencing the lookup table LUT.

(Procedure of Sharpness Processing)

Figure 15:
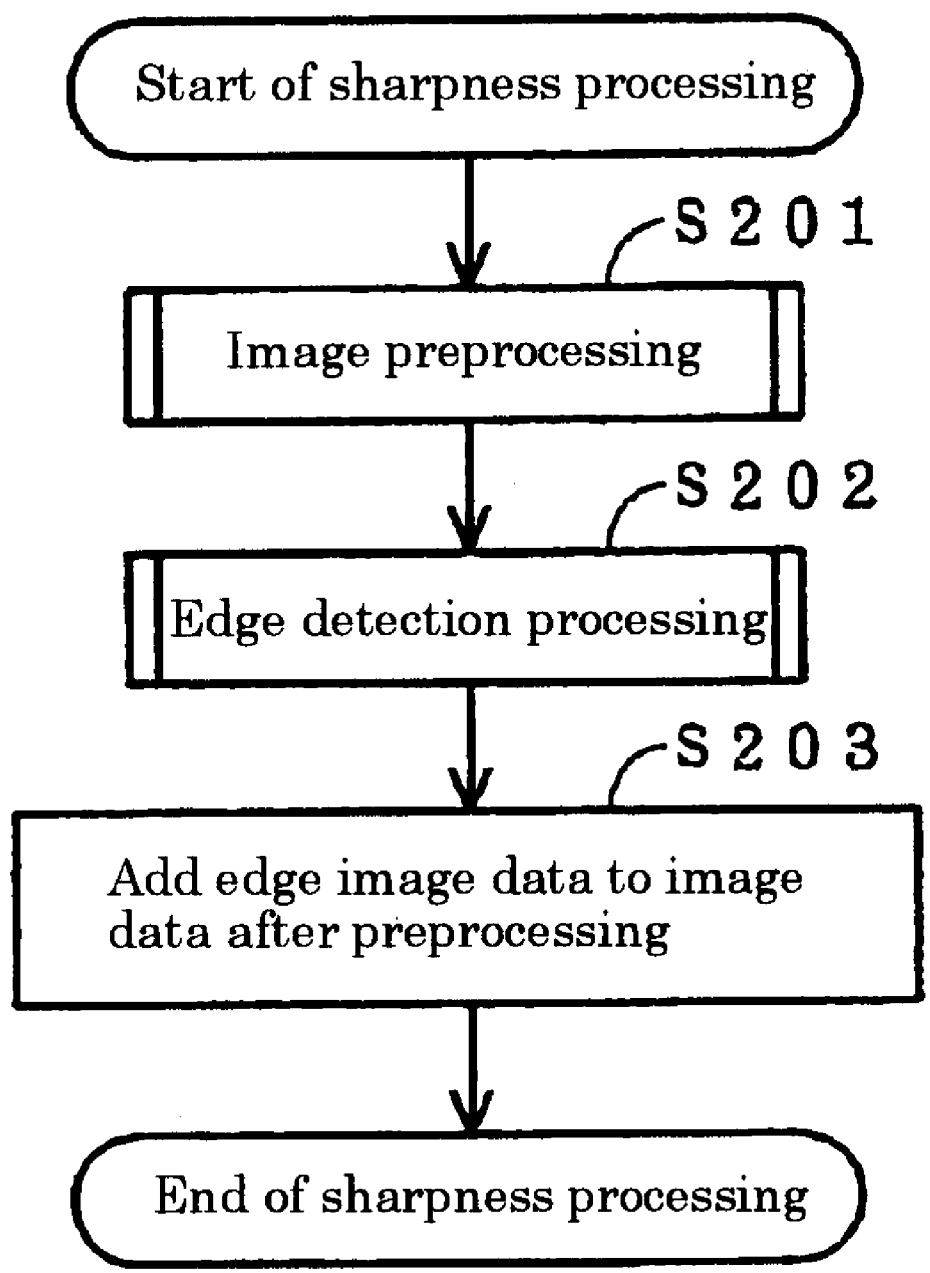
FIG. 15 is a flowchart showing an example of a concrete processing procedure performed in an embodiment of an information processing system according to the present invention.

A processing procedure of an application program to perform sharpness processing is shown in the flowchart of FIG. 15. The application program first performs image preprocessing to enhance image contrast and eliminate noise (step S201). Next, edge detection processing is performed to extract the contours of the image from the image subjected to image preprocessing (step S202). Finally, the extracted edge image data is added to the image data subjected to image preprocessing (step S203).

The application program 101 performs image preprocessing and edge detection processing in the hardware processing unit 103 and adds the edge image data in the CPU 102.

Since image data addition performed in the CPU 102 is performed in an information processing procedure by use of normal CPU, the image preprocessing and edge detection processing performed in the hardware processing unit 103 will be described below while showing the relationship between the addresses of a programmable logic circuit and circuit information.

[Address Configuration of Programmable Logic Circuit of FPGA type]

A programmable logic circuit of FPGA type used in this embodiment consists of 32 column and 32 row cells, a total of 1024 logic cells. A logic cell consists of configuration memories having 64 addresses and a configuration memory of one address retains eight-bit data. That is, one logic cell contains 64-byte circuit data.

Figure 16:
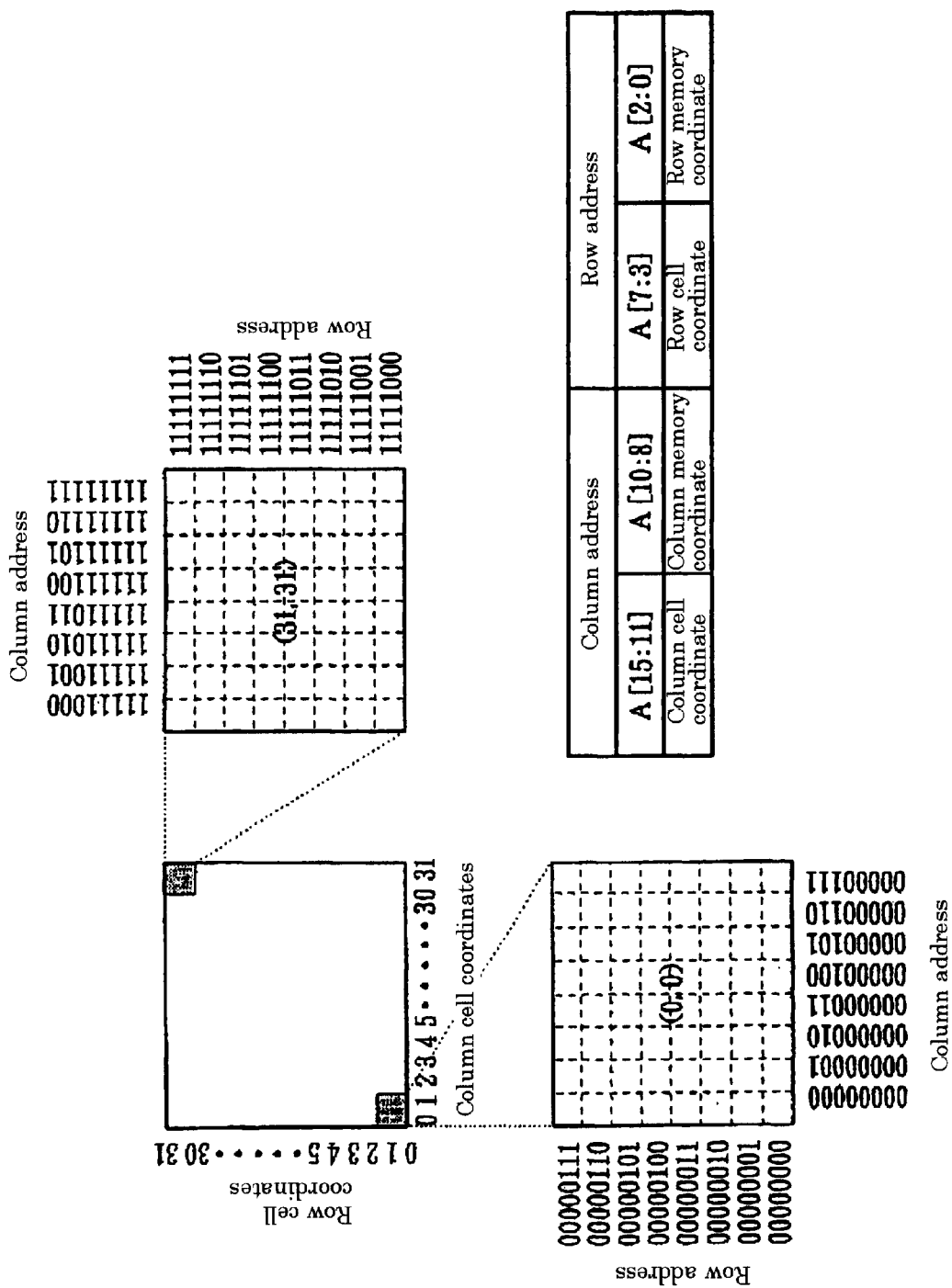
FIG. 16 is a diagram illustrating an address layout for forming a circuit in a programmable logic circuit in an embodiment.

FIG. 16 shows a method for addressing configuration memory. The cell coordinates of a programmable logic circuit are defined with the lower left corner as an origin (0, 0). A configuration memory in which one logic cell is set corresponds to an eight-by-eight memory space and a 256-by-256 memory space is formed in the entire programmable logic circuit. Addresses, which are 16-bit addresses beginning with "0x0000", are defined from the origin (0, 0) of cell coordinates to "0xFFFF".

At this time, addresses and cell coordinates have the following relationship. As shown in the table of FIG. 16, upper eight bits A[15:8] of 16-bit address A[15:0] correspond to a column address of 256-by-256 memory space and lower eight bits A[7:0] to a row address of the memory space.

Five bits A[15:11] (upper five bits of an eight-bit column address) of 16-bit address A[15:0] correspond to a column cell coordinate and three bits A[10:8] (lower three bits of an eight-bit column address) to a column memory coordinate. Five bits A[7:3] (upper five bits of an eight-bit row address) of 16-bit address A[15:0] correspond to a row cell coordinate and three bits A[2:0] (lower three bits of an eight-bit row address) to a row memory coordinate. By using this relationship, offset cell coordinates of input-output port information can be easily obtained from reference addresses.

(Image Preprocessing)

Figure 17:
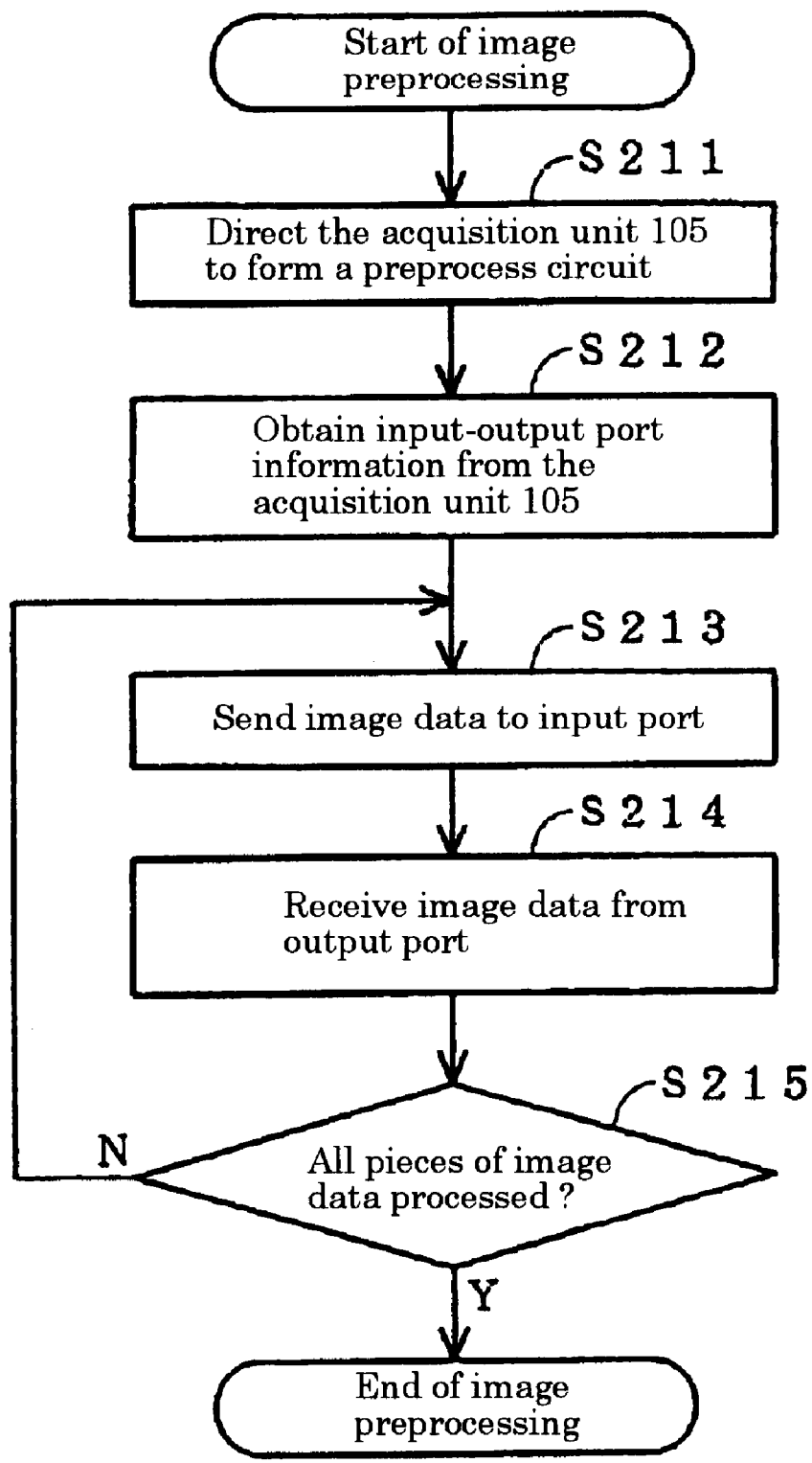
FIG. 17 is a flowchart showing an example of a concrete processing procedure performed in an embodiment of an information processing system according to the present invention.

FIG. 17 is a flowchart showing the procedure of image preprocessing performed in the hardware processing unit 103.

The application program 101 passes a circuit name "Preprocess" to the circuit information acquisition unit 105 and directs it to form a preprocess circuit in the hardware processing unit 103 (step S101 of FIG. 6 described previously and step S211 of FIG. 17).

Figure 7:
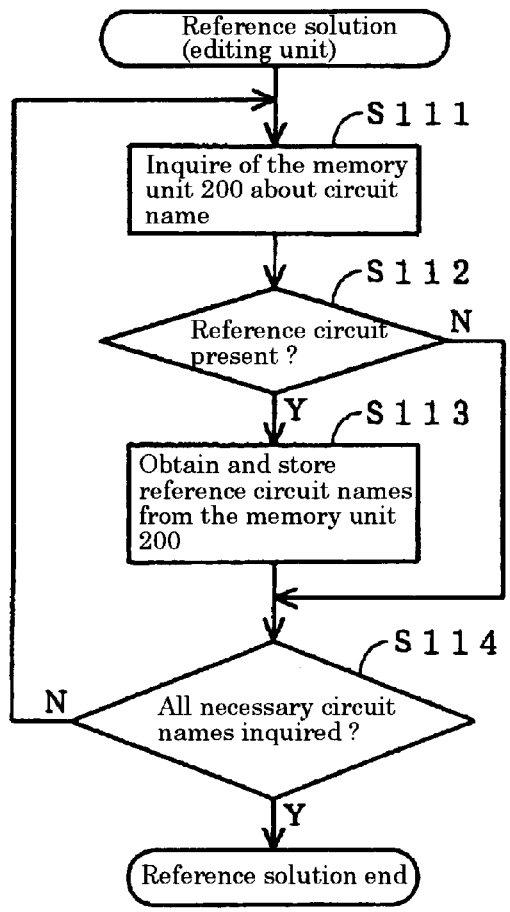
FIGS. 7A and 7B are flowcharts showing a detailed procedure of partial processing of the flowchart shown in FIG. 6.
Figure 7:
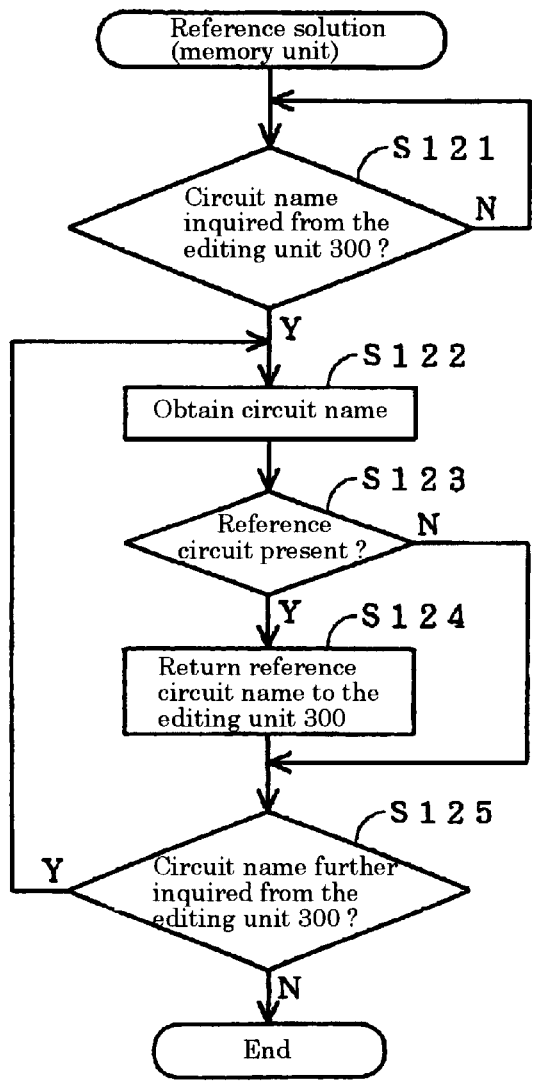
Figure 8:
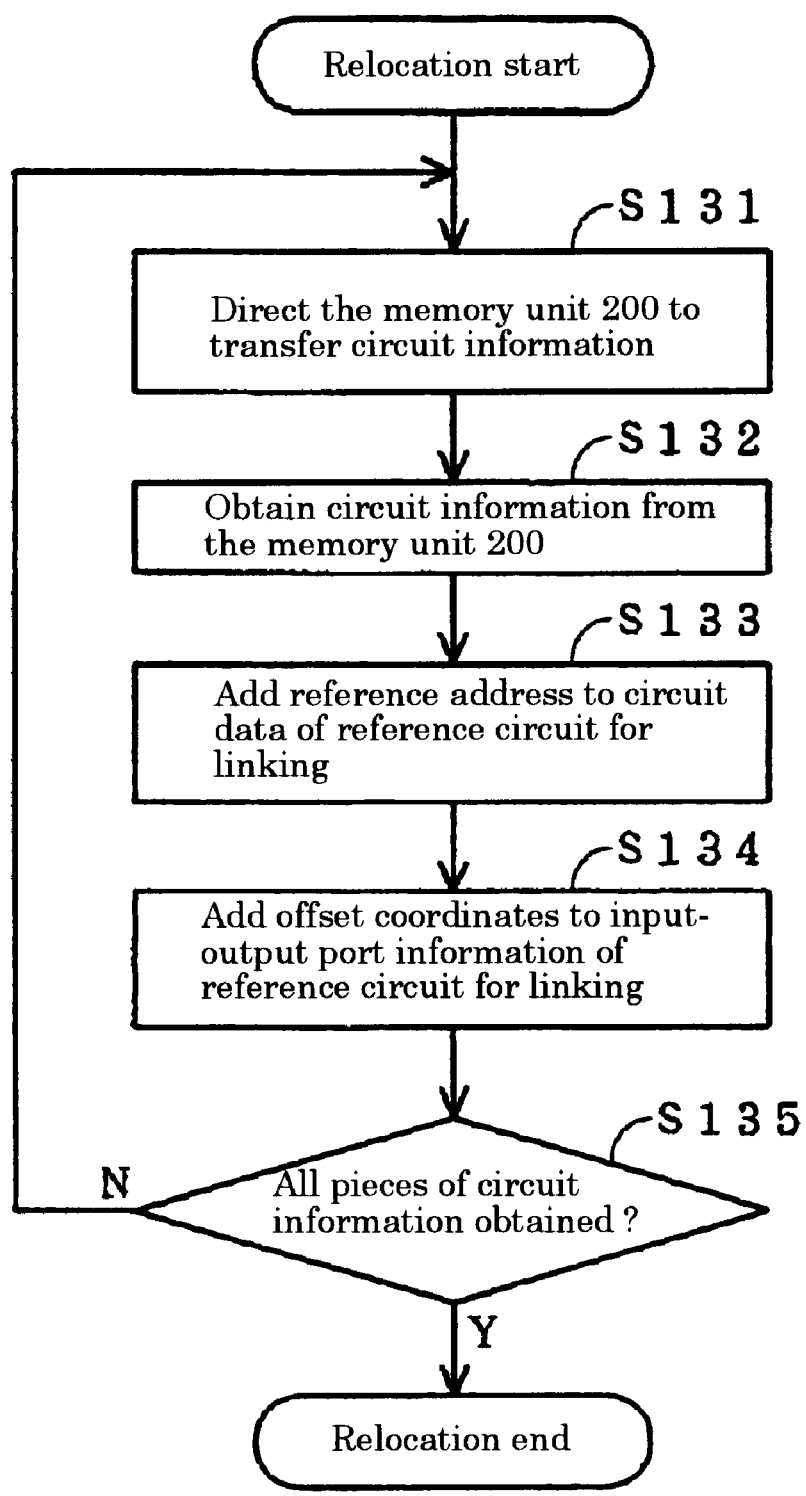
FIG. 8 is a flowchart showing a detailed procedure of partial processing of the flowchart shown in FIG. 6.

Then, as described previously, the circuit information acquisition unit 105 passes a circuit name "PreProcess" to the editing unit 300, which performs reference solution processing and relocation processing according to the procedure shown in FIGS. 6, 7, and 8 and generates circuit information of the image preprocess circuit, using circuit information stored in the memory unit 200.

Figure 18:
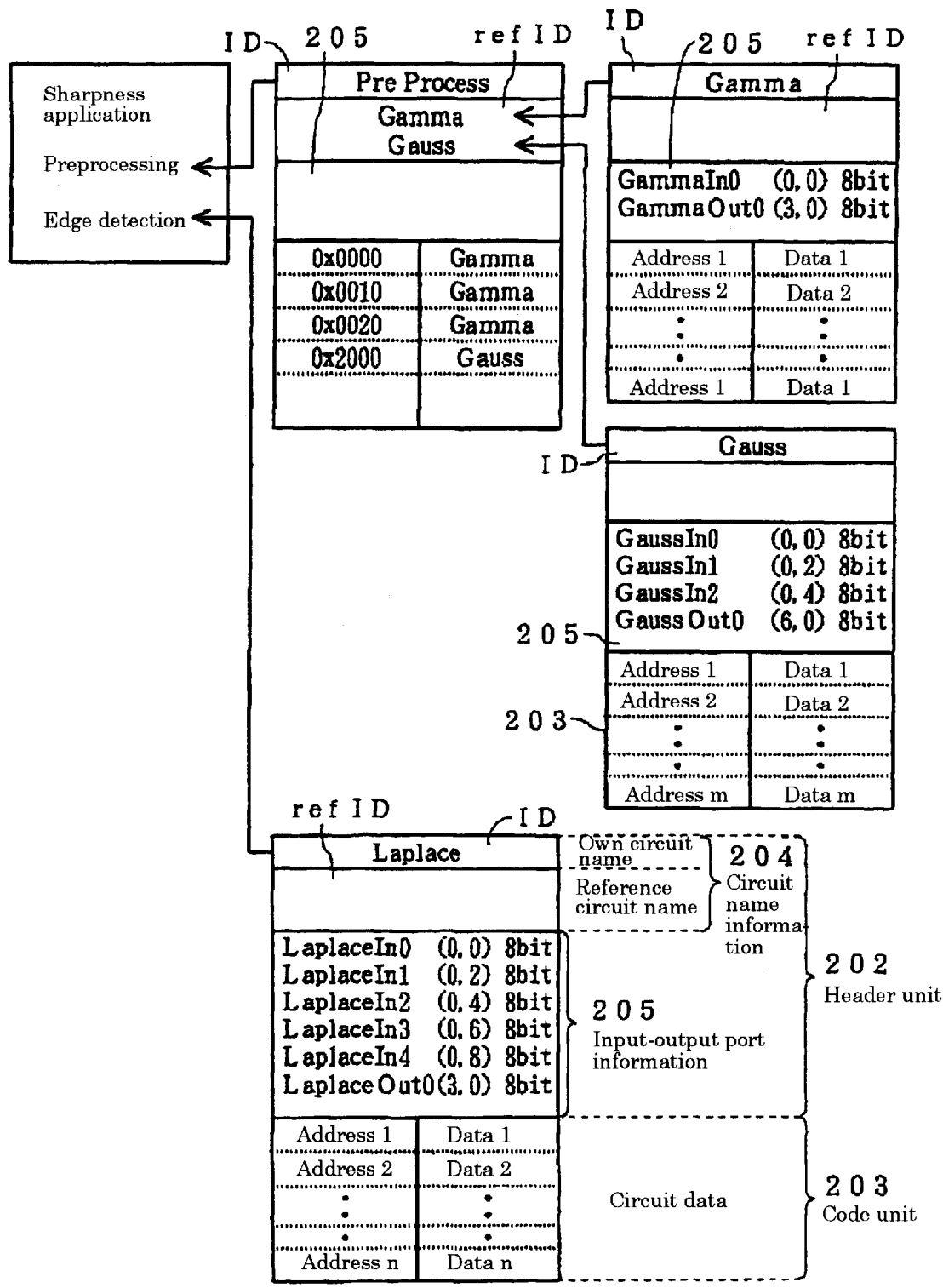
FIG. 18 is a diagram used for illustration of the processing procedure of FIG. 17.

In the case of this example, as shown in FIG. 18, circuit information of circuit name "PreProcess" is described so that reference circuit names "Gamma" and "Gauss" are contained in the header unit, and the code unit (data unit) is described so that a circuit name "Gamma" is referenced at addresses "0x0000", "0x0010", and "0x0020" and a circuit name "Gauss" is referenced at an address "0x2000".

Accordingly, in the reference solution processing (see step S103 of FIG. 6 and FIG. 7), the memory unit 200 returns reference circuit names "Gamma" and "Gauss" for an inquiry about a circuit name "PreProcess" from the editing unit 300. Next, the editing unit 300 inquires of the memory unit 200 about circuit names "Gamma" and "Gauss", but as shown in FIG. 18, in this example, since neither of the circuits has a reference circuit, the reference solution processing (step S103) terminates at this point.

The editing unit 300 performs relocation processing (step S104 of FIG. 6) that adds the address ADR of circuit data of circuit name "Gamma" by its reference addresses "0x0000", "0x0010", and "0x0020" as offset, respectively, thereby linking the circuit data of circuit name "Gamma" to the circuit data of reference source circuit name "PreProcess". Also, the circuit data of circuit name "Gauss" is linked to the circuit data of reference source circuit name "Preprocess" by adding its reference address "0x2000" as offset.

The reference addresses "0x0000, "0x0010", and "0x0020" of circuit name "Gamma" in the circuit data unit of reference source circuit name "PreProcess" correspond to cell coordinates (0, 0), (0, 2), and (0, 4), respectively, and a reference address "0x2000" of circuit name "Gauss" corresponds to a cell coordinate (4, 0). Therefore, the input-output port coordinates of circuit name "Gamma" are added by (0, 0), (0, 2), and (0, 4) as offset and the input-output port coordinate of circuit name "Gauss" is added by (4, 0) as offset so that they are linked to the input-output port coordinates of reference source circuit name "PreProcess".

Upon termination of generation of circuit information of the circuit named "PreProcess" at the editing unit 300, the circuit information is transferred from the editing unit 300 to the circuit information acquisition unit 105 (step S106 of FIG. 6).

The circuit information acquisition unit 105 loads the circuit data of the transferred circuit information into the programmable logic circuit 104 of the hardware processing unit 103 and forms the preprocess circuit in the programmable logic circuit 104 (step S106 of FIG. 6). The circuit layout of the preprocess circuit formed in the programmable logic circuit 104 is shown in FIG. 19.

The circuit information acquisition unit 105 offers input-output port information to the application program 101 (step S107 of FIG. 6 and step S212 of FIG. 17).

On receiving the input-output port information, the application program 101, based on the input-output port information, sends image data to input ports "GammaIn0 (0, 0)", "GammaIn1 (0, 2)", and "GammaIn2 (0, 4)" of the image preprocess circuit formed in the programmable logic circuit 104 of the hardware processing unit 103 (step S213), and receives the image data subjected to preprocessing at output port "GaussOut0 (10, 0)" (step S214).

Figure 19:
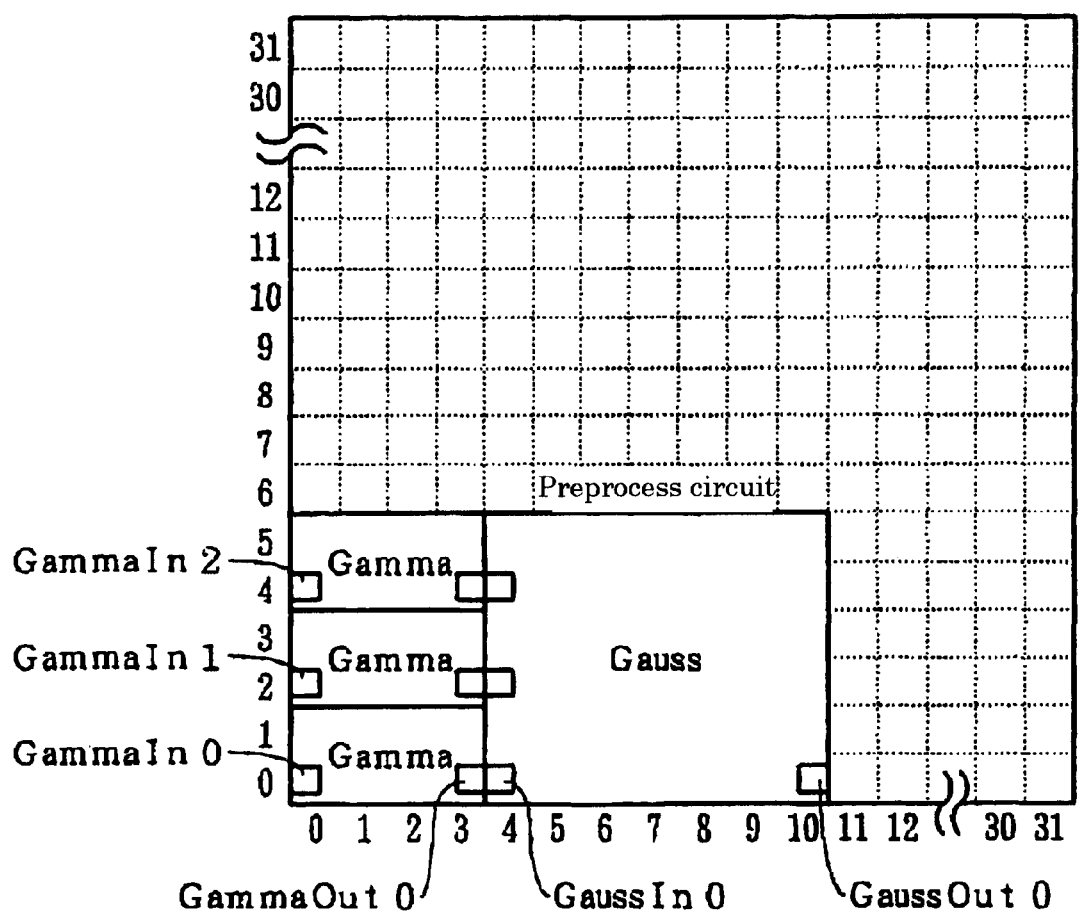
FIG. 19 is a diagram used for illustration of the processing procedure of FIG. 17.

At this time, as shown in FIG. 19, since output ports "GammaOut0 (3, 0) "GammaOut1 (3, 2)", and "GammaOut2 (3, 4)" in the input-output port information are adjacent to input ports "GaussIn0 (4, 0)", "GaussIn1 (4, 2)", and " GaussIn2 (4, 4)", respectively, the application program 101 determines that these ports are internally connected.

Accordingly, the application program 101 determines that "GammaIn0 (0, 0)", "GammaIn1 (0, 2)", and "GammaIn2 (0, 4)" are input ports of the circuit "PreProcess" and "GaussOut0 (10, 0)" is an output port of the circuit "PreProcess".

When it is confirmed that input of image data to the input ports of the image preprocess circuit formed in the programmable logic circuit 104 and reception of the image data at a corresponding output port have been performed for all pieces of image data (step S215), the image preprocessing terminates.

(Edge Detection Processing)

Next, the application program 101 performs edge detection processing for the image data subjected to preprocessing (step S202 of FIG. 15). The procedure of edge detection processing performed in the hardware processing unit 103 is shown by the flowchart of FIG. 20.

Figure 20:
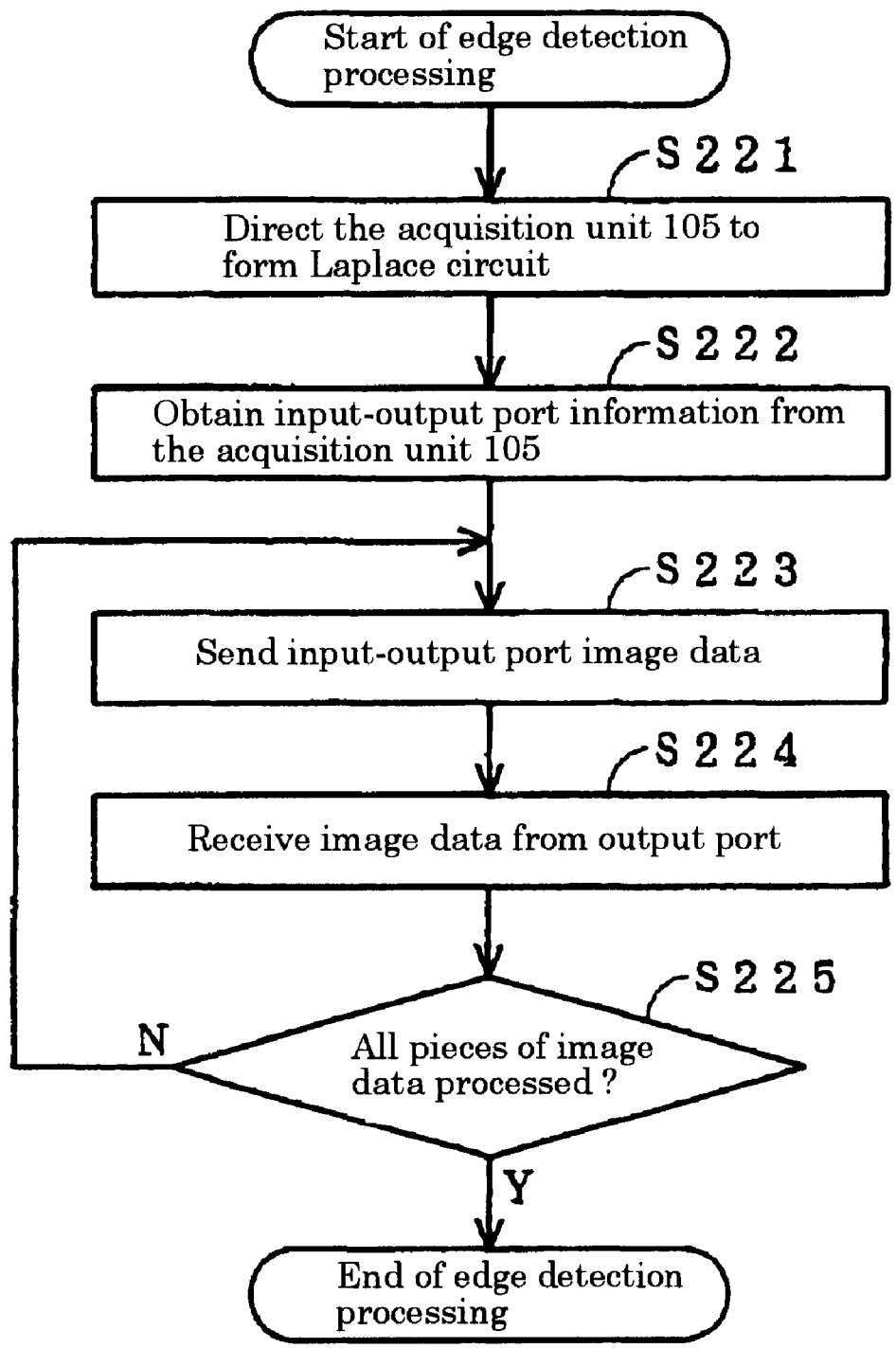
FIG. 20 is a flowchart showing an example of a concrete processing procedure performed in an embodiment of an information processing system according to the present invention.

The application program 101 passes a circuit name "Laplace" to the circuit information acquisition unit 105 and directs it to form an edge detection circuit in the hardware processing unit 103 (step S101 of FIG. 6 and step S221 of FIG. 20). As described previously, the circuit information acquisition unit 105 passes a circuit name "Laplace" to the editing unit 300, the editing unit 300 performs reference solution processing and relocation processing according to the procedure shown in FIGS. 6, 7, and 8, and generates circuit information of the edge detection circuit using the circuit information stored in the memory unit 200.

As shown in FIG. 18, in the case of this example, circuit information of circuit name "Laplace" has no reference circuit name. Therefore, although the editing unit 300 inquires of the memory unit 200 about the circuit name "Laplace", the reference solution processing terminates at this point because there is no reference circuit.

In relocation processing of step S104 of FIG. 6, since circuit information of circuit name "Laplace" has no reference circuit, no offset operation need be performed for circuit data and input-output port information and the editing unit 300 terminates relocation processing when circuit information of circuit name "Laplace" is obtained from the memory unit 200.

Upon termination of generation of circuit information of circuit name "Laplace", the editing unit 300 transfers the circuit information to the circuit information acquisition unit 105 (step S105 of FIG. 6). The circuit information acquisition unit 105 loads the circuit data of the transferred circuit information into the programmable logic circuit 104 of the hardware processing unit 103 and forms a Laplace circuit in the programmable logic circuit 104 (step S106 of FIG. 6). The circuit layout of the Laplace circuit formed in the programmable logic circuit 104 is shown in FIG. 21.

Figure 21:
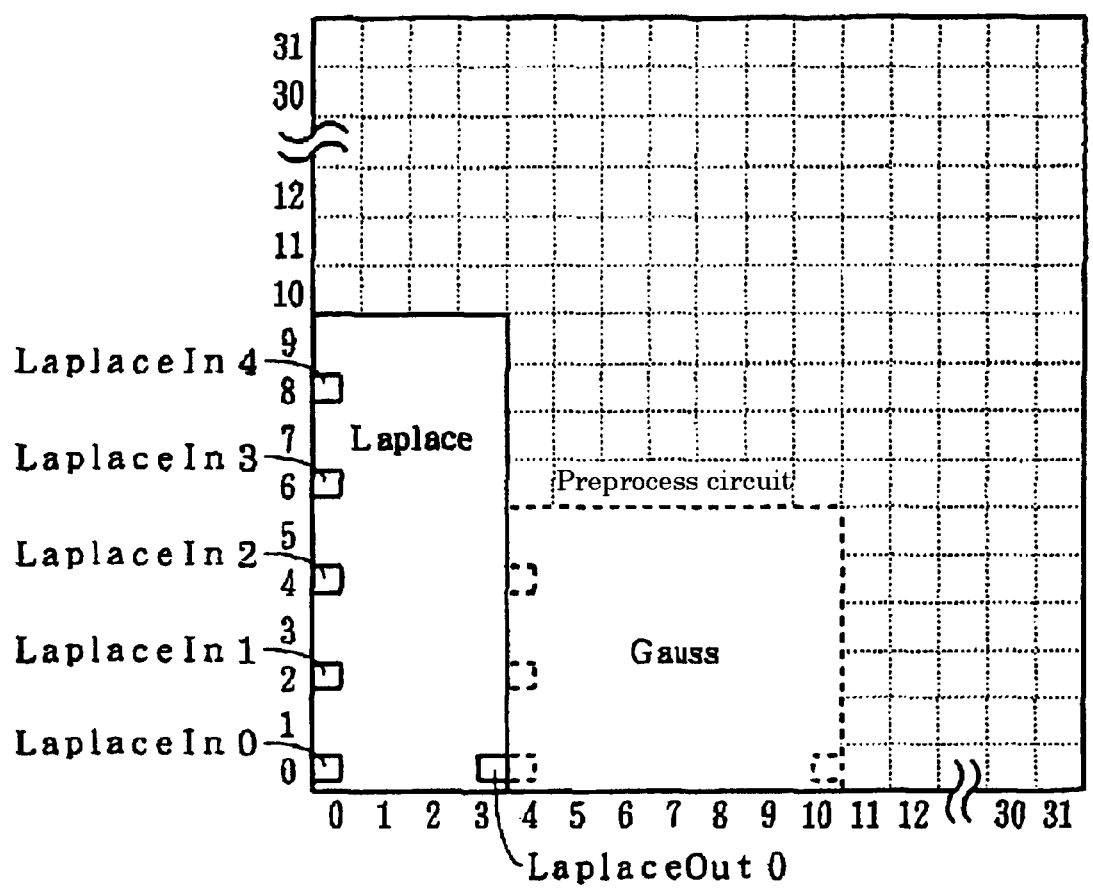
FIG. 21 is a diagram used for illustration of the processing procedure of FIG. 20.

As shown in FIG. 21, the Laplace circuit occupies an address space overlapping that of the preprocess circuit indicated by the dotted lines. Consequently, if the Laplace circuit is formed, the preprocess would not operate. However, there is no problem because processing using the preprocess circuit has already terminated.

The circuit information acquisition unit 105 offers input-output information to the application program 101 (step S107 of FIG. 6 and step S222 of FIG. 20).

On receiving the input-output port information, the application program 101, based on the input-output port information, sends image data to input ports "LaplaceIn0 (0, 0)", "LaplaceInl (0, 2)", "LaplaceIn2 (0, 4)", "LaplaceIn3 (0, 6)", and "LaplaceIn4 (0, 8)" of the image preprocess circuit formed in the programmable logic circuit 104 of the hardware processing unit 103 (step S223), and receives the image data subjected to edge detection processing at output port "LaplaceOut0 (3, 0)" (step S224).

When it is confirmed that input of image data to the input ports of the edge detection circuit formed in the programmable logic circuit 104 and reception of the image data at a corresponding output port have been performed for all pieces of image data (step S225), the edge detection processing terminates.

(Edge Data Addition)

Finally, the extracted edge image data is added to the image data subjected to preprocessing by the CPU 102 to obtain a clear image before terminating the sharpness processing (step S203 of FIG. 15).

Second Embodiment

The first embodiment described above uses a programmable logic circuit of FPGA type. However, since CPLD (Complex Programmable Logic Device) comprises functional blocks periodically repeated, like FPGA comprising logic cells periodically repeated, the present invention may also be applied with a programmable logic circuit of the CPLD type.

[Programmable Logic Circuit of the CPLD Type]

Figure 22:
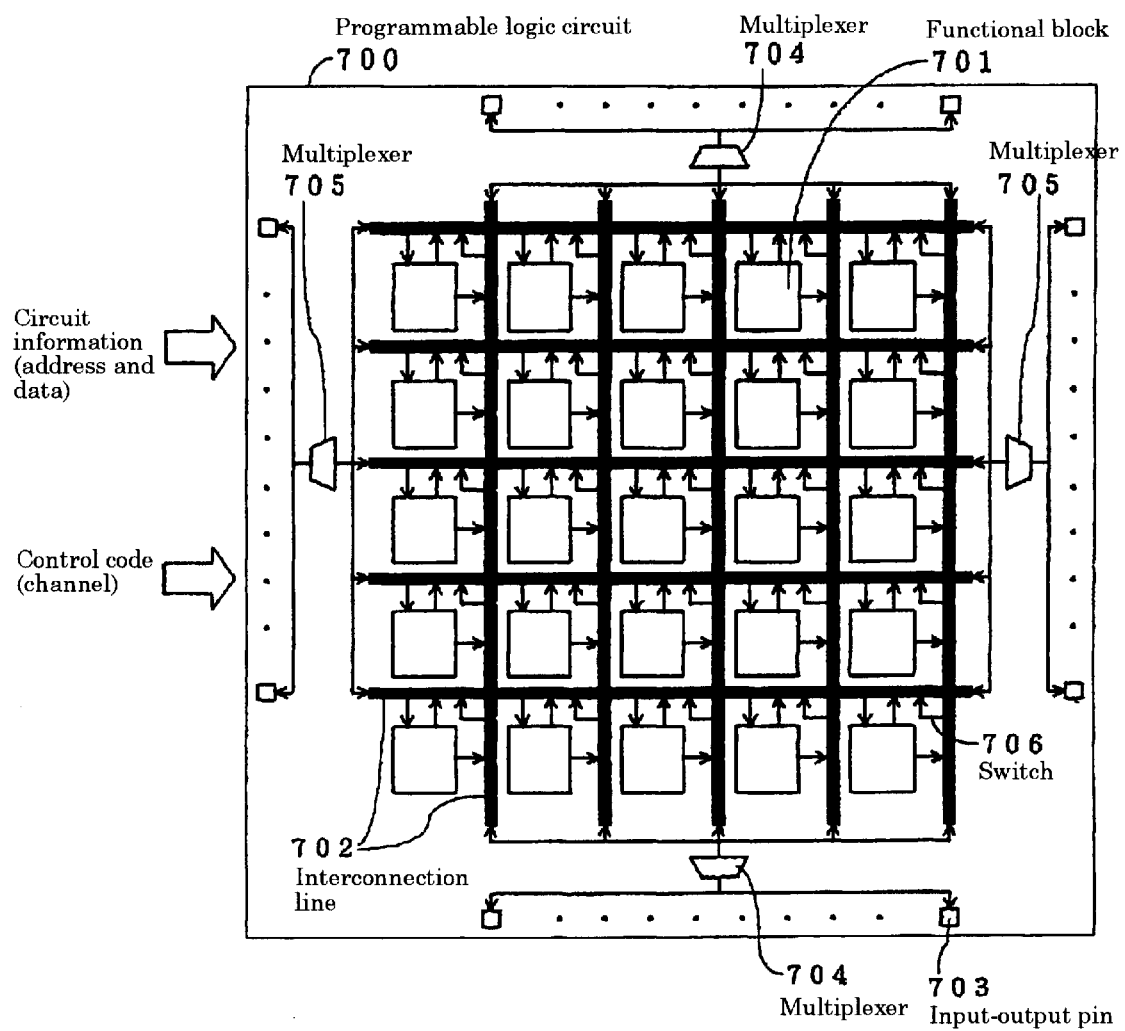
FIG. 22 is a diagram for illustrating a programmable logic circuit of CPLD type.
Figure 23:
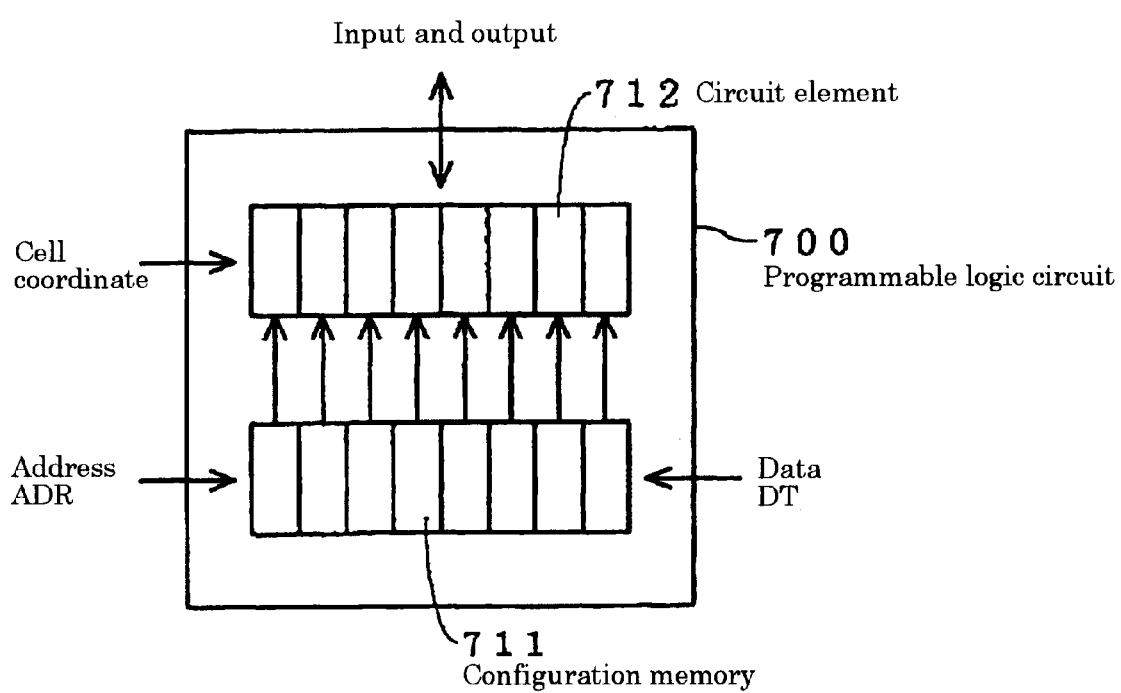
FIG. 23 is a diagram for illustrating a programmable logic circuit of CPLD type.

The plane structure of a programmable logic circuit 700 of CPLD type is shown in FIG. 22 and a block diagram of an internal structure thereof is shown in FIG. 23. The programmable logic circuit 700 comprises configuration memory 711 for storing circuit information, circuit elements 712 comprising functional blocks 701 and interconnection lines 702 comprising a plurality of wirings, and input-output pins 703.

The configuration memory 711 comprises erasable memory devices such as EEPROM and SRAM. Circuit data consists of pairs of address and data. When an address is afforded to the configuration memory 711 and data paired with the address is stored in a memory cell corresponding to the address, in accordance with the data, the circuit makeup of the functional blocks 701 and the connection state of the interconnection lines 702 to interconnect the functional blocks 701 with input-output pins 703 are changed. By modifying part of the configuration memory 711, the programmable logic circuit 700 can be partially re-formed even when the circuit is busy.

Data to be processed is inputted to the circuit elements 712 re-formed in the programmable logic circuit 700 through the input-output pins 703 and processing results are outputted.

As will be described later, the function blocks 701 input data from interconnection lines 702 running in row direction and output data to interconnection lines 702 running in column direction. Accordingly, input data is inputted to an interconnection line 702 designated by a multiplexer 705 through input-output pins 703 connected to interconnection lines 702 running in row direction. Output data is outputted from input-output pins 703 connected to an interconnection line 702 running in column direction, designated by the multiplexer 704. The interconnection lines 702 to and from which to input and output data are designated by the application program 101 using a control code to specify channels indicating the respective wirings of the interconnection lines.

[Structure of Functional Block]

Figure 24:
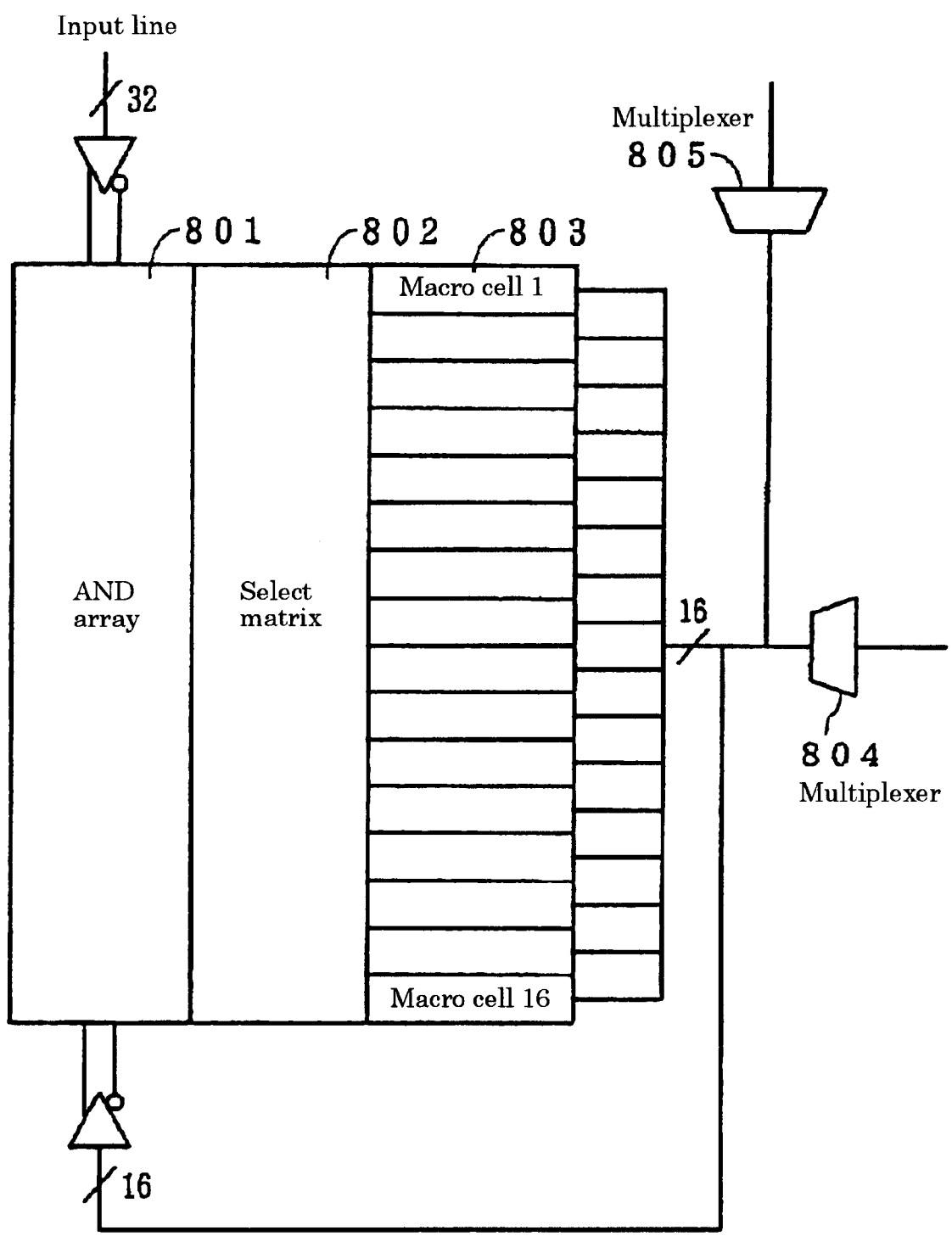
FIG. 24 is a diagram for illustrating a programmable logic circuit of CPLD type.

FIG. 24 shows the structure of a functional block 701. The function block 701 comprises an AND array 801, a select matrix 802, and 16 macro cells 803. To the AND array 801 of the functional block 701, 32 input lines are connected from an interconnection line 702 in row direction.

From each macro cell 803, one output line is connected to an interconnection line 702 designated by a multiplexer 804, and an output from each macro cell 803 is fed back to the AND array 801.

Figure 25:
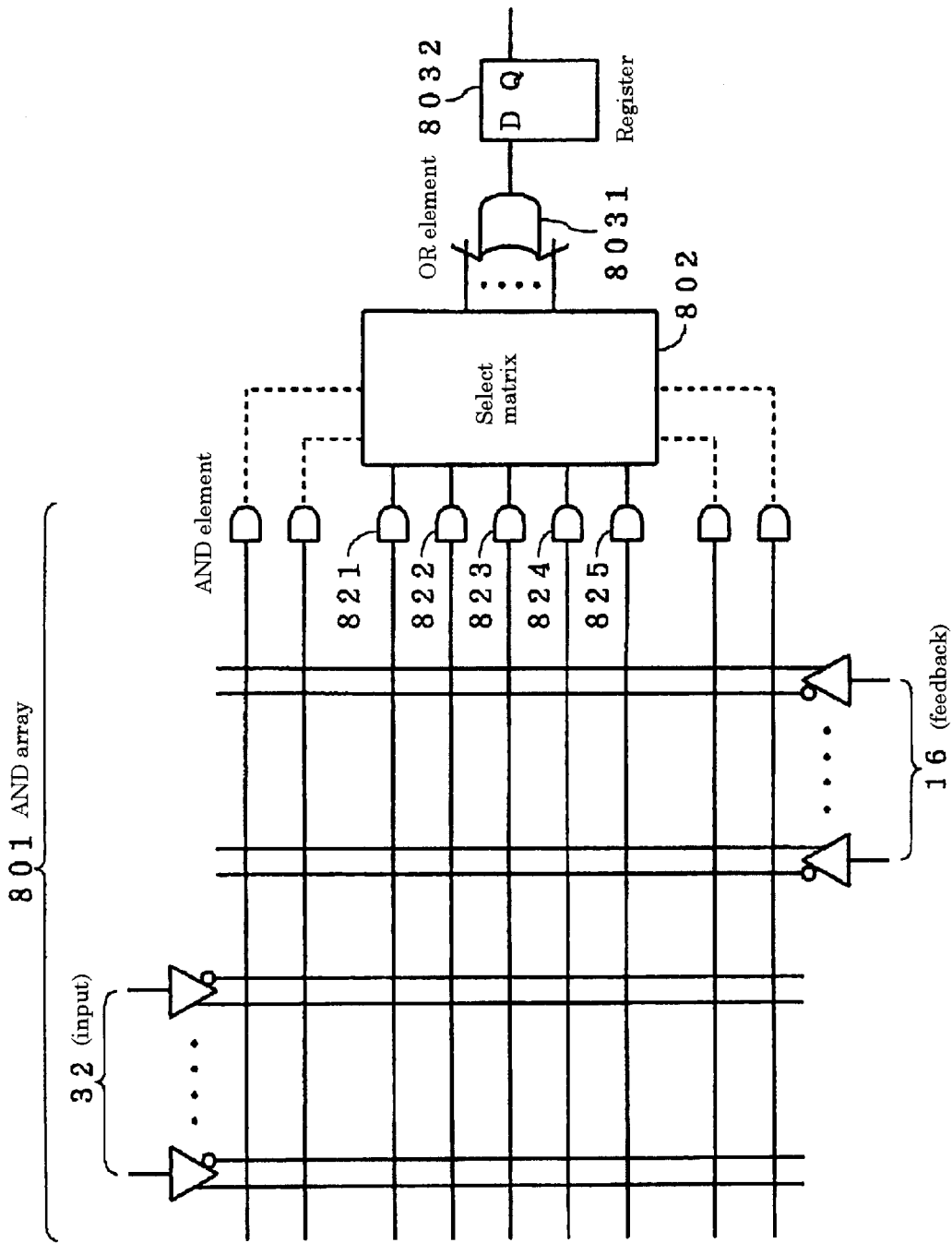
FIG. 25 is a diagram for illustrating a programmable logic circuit of CPLD type.

FIG. 25 shows a detailed structure of a functional block 701 corresponding to one macro cell 803.

An AND array 801 corresponding to one macro cell 803 is formed with a matrix wiring comprising a wiring in column direction, which comprises 32 inputs from an interconnection line 702 in row direction and 32 reverse inputs thereof, and 16 feedback lines from a macro cell 803 and 16 reverse inputs thereof, and a wiring in row direction, which comprises the input lines of five AND elements 821 to 825 (AND elements inputted to the select matrix 802) per macro cell 803.

Intersections of the matrix wiring of the AND array 801 are connected according to data of configuration memory 711, determining an input to the macro cell 803. Next, the select matrix 802, according to the data of configuration memory 711, inputs an output selected from five AND elements arranged for one macro cell and AND elements for other macro cells to OR elements 8031. An output of the OR elements 8031 is stored in register 8032. In this way, a well-known AND-OR logic is formed.

[Connection of Functional Blocks]

As shown in FIG. 24, the functional blocks 701 can also make output to the interconnection lines 702 in row direction through the multiplexer 805. An output of functional blocks 701 connected to interconnection lines 702 in row direction can become an input of other functional blocks.

As shown in FIG. 22, switches 706 for connecting interconnection lines 702 in row direction with column direction may be provided at intersections of the interconnection lines 702. By connecting the output of a functional block 701 to an interconnection line 702 in column direction to an interconnection line 702 in row direction through the switch 706, the output of the functional block 701 can be used as an input to other functional blocks 701.

As described above, like FPGA comprising logic cells periodically repeated, since CPLD also comprises functional blocks periodically repeated, the procedure described in the first embodiment can also be applied to the case where the hardware processing unit 103 comprises programmable logic circuits of CPLD type. This is shown as an embodiment of the case where the image preprocess circuit in the above-mentioned sharpness processing is formed in a programmable logic circuit of CPLD type.

[Configuration of Filter Circuit]

As already known, circuits that can be formed in programmable logic circuits of FPGA type can be formed in programmable logic circuits of CPLD type. In the case of this embodiment, a circuit (circuit name Gauss) to implement Gaussian filter processing can be formed using six functional blocks and a circuit (circuit name Gamma) to implement a filter for gradation conversion can be formed with one functional block.

In this case, the circuit must be formed so that an output of the functional blocks is presented to an interconnection line 702 in column direction through the multiplexer 804 and to an interconnection line 702 in row direction through the multiplexer 805. By taking this configuration, as will be described later, a circuit connected by an offset operation enables a connecting circuit to receive a signal outputted to an interconnection line 702 in row direction as an input. A final output is passed to an application program through an interconnection line 702 in column direction.

[Address Configuration of Programmable Logic Circuit of CPLD Type]

A programmable logic circuit of CPLD type used in this embodiment comprises 32 in row direction and 32 in column direction, a total of 1024 functional blocks. One functional block consists of configuration memories having 64 addresses and a configuration memory of one address retains eight-bit data. That is, one functional block contains 64-byte circuit data.

The configuration memories are addressed in the same way as with programmable logic circuits of FPGA type shown in FIG. 16. That is, the functional block coordinates of a programmable logic circuit are defined with the lower left corner as an origin (0, 0). A configuration memory in which one logic functional block is set corresponds to an eight-by-eight memory space and a 256-by-256 memory space is formed in the entire programmable logic circuit. Addresses, which are 16-bit addresses beginning with "0x0000", are defined from the origin (0, 0) of functional block coordinates to "0xFFFF".

At this time, addresses and functional blocks have the following relationship. Upper eight bits A[15:8] of 16-bit address A[15:0] correspond to a column address of a 256-by-256 memory space and lower eight bits A[7:0] to a row address of the memory space. Five bits A[15:11] of 16-bit address A[15:0] correspond to a column functional block coordinate and five bits A[7:3] correspond to a row functional block coordinate. By using this relationship, offset functional block coordinates of input-output port information can be easily obtained from reference addresses.

(Image Preprocessing)

The procedure of image preprocessing performed in the hardware processing unit 103 is the same as that shown in the above-described flowchart of FIG. 17. The application program 101 passes a circuit name "PreProcess" to the circuit information acquisition unit 105 and directs it to form a preprocess circuit in the hardware processing unit 103. Then, like the above-mentioned case, reference solution processing and relocation processing are performed by the editing unit 300 and the memory unit 200 according to the procedure shown in FIGS. 6, 7, and 8 so that circuit information of the preprocess circuit is generated.

Figure 26:
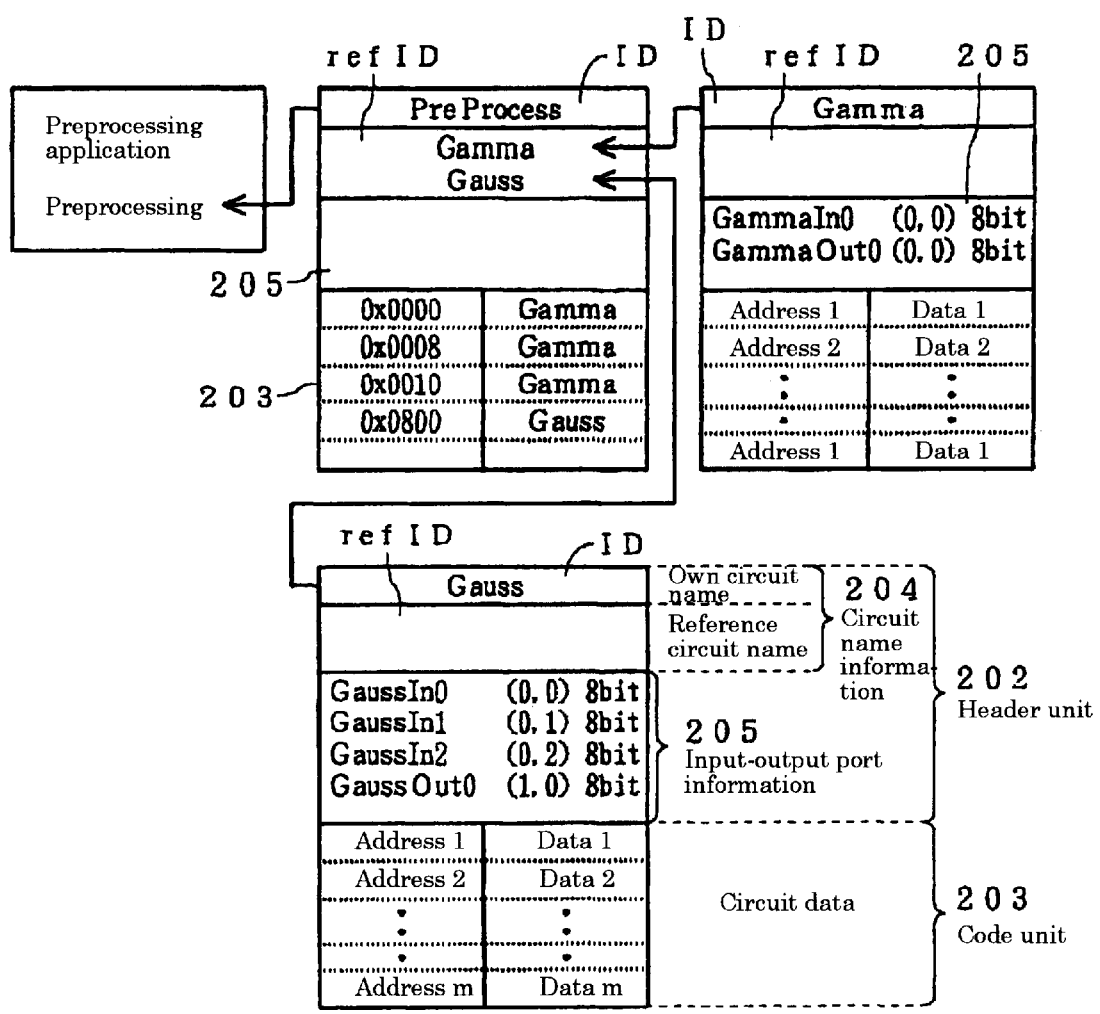
FIG. 26 is a diagram used for illustration of a concrete processing procedure at the use of a programmable logic circuit of CPLD type.

In the case of this embodiment, as shown in FIG. 26, circuit information of a circuit name "PreProcess" is described so that a circuit name "Gamma" is referenced at addresses "0x0000", "0x0008", and "0x0010" and a circuit name "Gauss" is referenced at an address "0x0800".

Accordingly, in the reference solution processing, in response to an inquiry about a circuit name "PreProcess" from the editing unit 300, the memory unit 200 returns circuit names "Gamma" and "Gauss". Next, the editing unit 300 inquires of the memory unit 200 about circuit names "Gamma" and "Gauss", but since both of them have no reference circuits, the reference solution processing terminates.

In relocation processing, the circuit data of circuit name "Gamma" is linked to the circuit data of the reference source circuit name "PreProcess" by adding Gamma reference addresses "0x0000", "0x0008", and "0x0010" as offset to the address of the circuit data of circuit name "Gamma". The circuit data of circuit name "Gauss" is linked to the circuit data of the preprocess circuit by adding a Gauss reference address "0x0800" as offset.

The reference addresses "0x0000", "0x0008", and "0x0010" of circuit name "Gamma" in the circuit data unit of reference source circuit name "PreProcess" correspond to functional block coordinates (0, 0), (0, 1), and (0, 2), respectively, and a reference address "0x0800" of circuit name "Gauss" correspond to a functional block coordinate (1, 0). Therefore, the input-output port coordinates of circuit name "Gamma" are added by (0, 0), (0, 1), and (0, 2) as offset and the input-output port coordinate of circuit name "Gauss" is added by (1, 0) as offset so that they are linked to the input-output port coordinates of the reference source circuit name "PreProcess".

Upon termination of generation of circuit information of the preprocess circuit, the editing unit 300 transfers the circuit information to the circuit information acquisition unit 105. The circuit information acquisition unit 105 loads the circuit data of the transferred circuit information into the programmable logic circuit to form the preprocess circuit. Input-output port information is offered to the application program.

Figure 27:
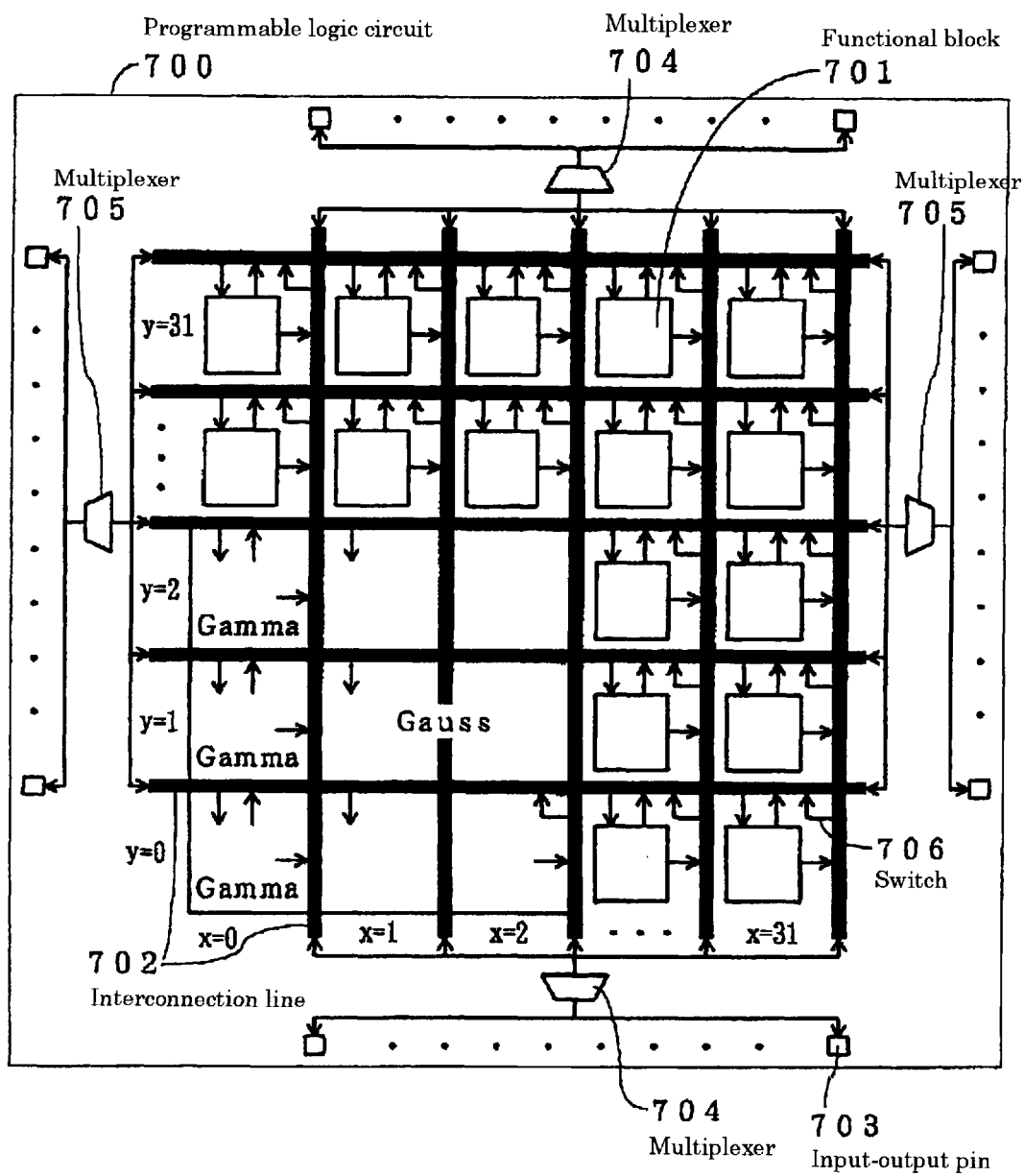
FIG. 27 is a diagram illustrating an example of layout of circuits formed in a programmable logic circuit of CPLD type.
Figure 28:
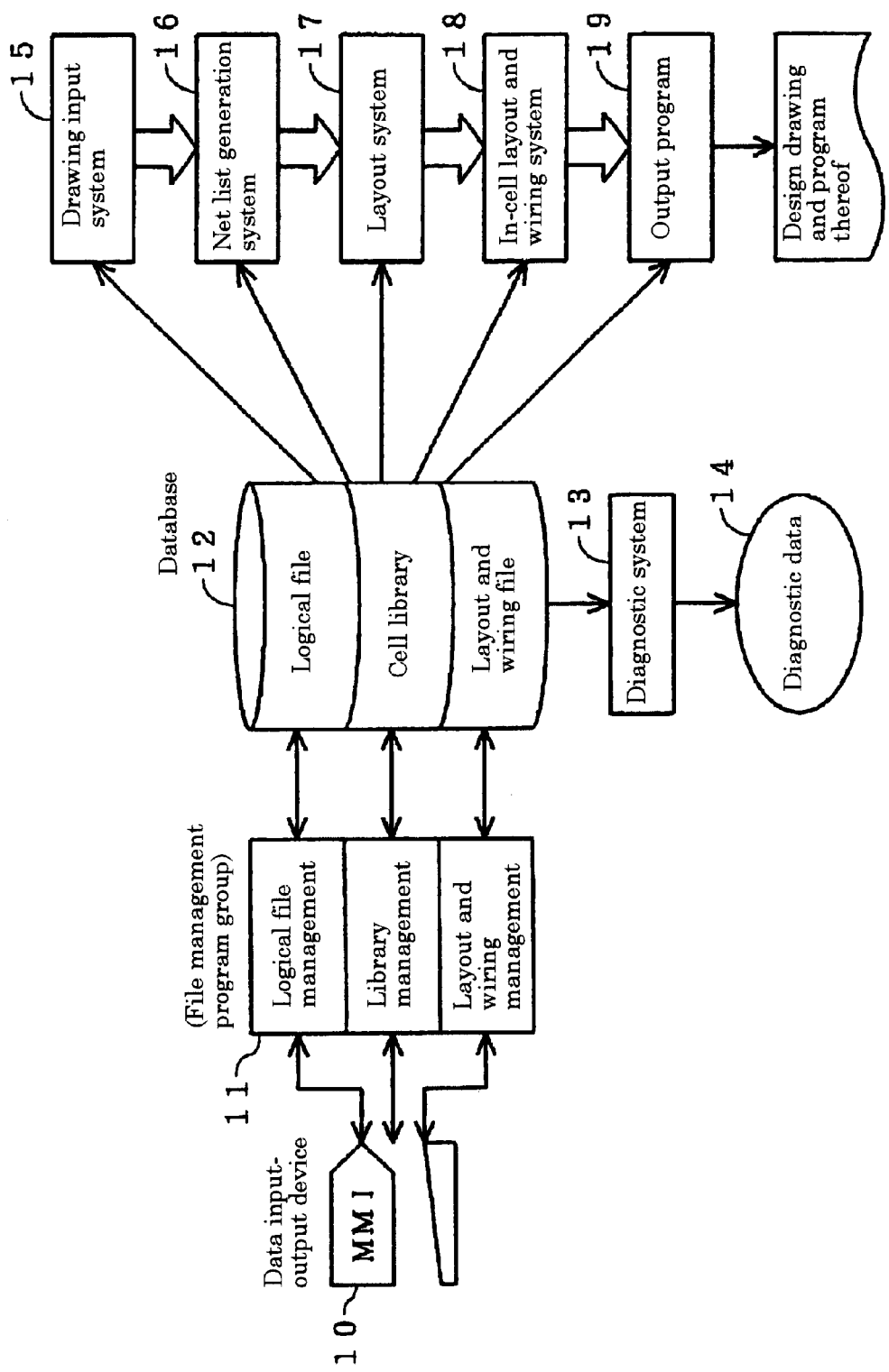
FIG. 28 is a diagram for illustrating an example of a conventional information processing system.
Figure 29:
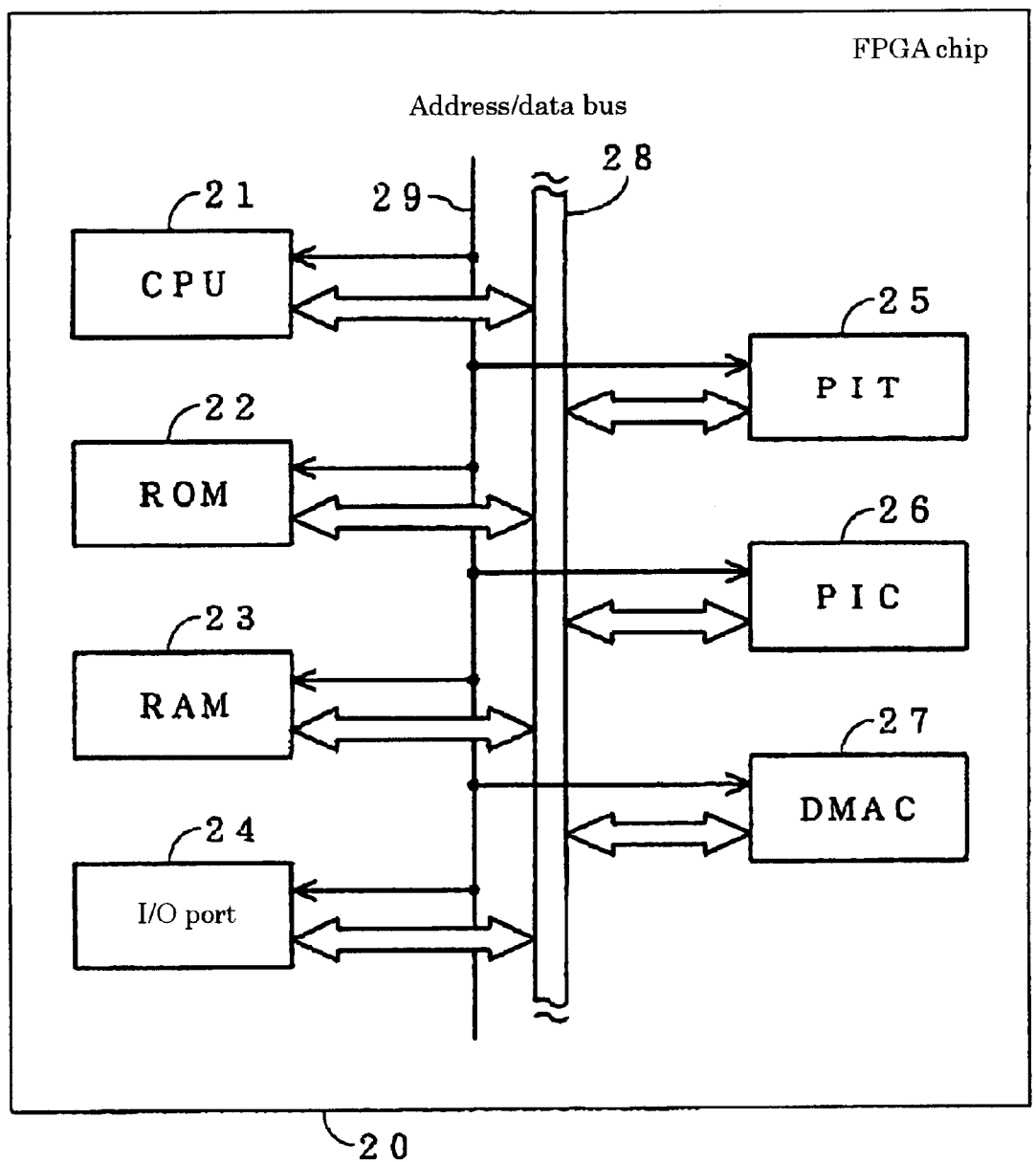
FIG. 29 is a diagram showing an example of a programmable logic circuit produced by the conventional example of FIG. 28.
Figure 30:
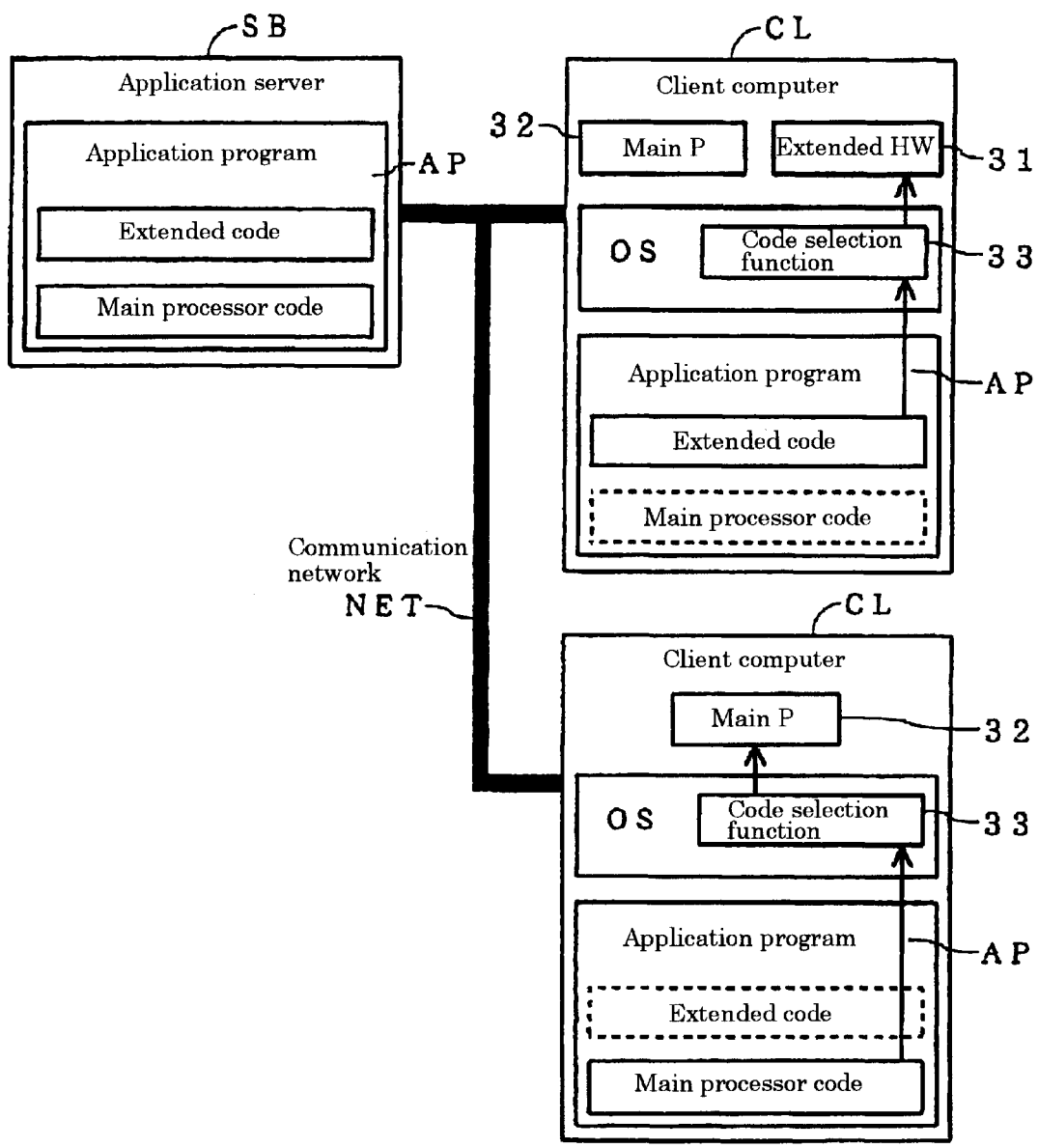
FIG. 30 is a diagram for illustrating another example of a conventional information processing system.

As shown in FIG. 27, the output of a circuit named "Gamma" is connected to the input of a circuit named "Gauss" through interconnection lines in row direction. The output of a circuit named "Gauss" is passed to the application program through interconnection lines in column direction.

According to the first and second embodiments described above, circuit information is described in a format capable of being directly loaded into configuration memories of a programmable logic circuit so that the circuit information can be reused. Therefore, circuit information can be reused by short-time processing without layout and wiring processing that involves a great amount of computation.

This eliminates the need for forming of circuits before starting an application program because required circuits can be formed by combining pieces of circuit information.

Since required circuits can be formed by combining pieces of circuit information during execution of an application program, even when modifications or improvements of circuit information for forming a circuit occur, the circuit information can be re-formed with high flexibility.

Since circuit information can be described with reference to other circuit information, circuit information of an entire circuit need not be re-created because of modifications or improvements in part of the circuit and only circuit information of a modified reference circuit has to be re-created, so that the circuit can be re-formed quickly.

Since circuit information stored in a memory unit placed on a network can be referenced, circuit designers and application programmers can share and reuse circuit information over the network, so that circuits can be re-formed with higher flexibility.

Since input-output port information is offered to an application program when circuit information is referenced and shared, the application program can be easily created in whatever form the circuit is implemented. After the application has been created, the circuit implementation form can be easily changed.

Reference solution processing may be performed in only the editing unit 300 though it has been performed in the editing unit 300 and the memory unit 200 in the above description. That is, the editing unit 300 passes a circuit name to the memory unit 200, which in turn sends circuit information of the circuit name to the editing unit 300. The editing unit 300 analyzes the circuit information, determines whether a reference circuit name exists, passes it, if any, to the memory unit 200, and obtains circuit information of the reference circuit name. Hereinafter, by repeating this process, all pieces of circuit information required to generate circuit information of a circuit specified in the circuit information acquisition unit 105 can be obtained from the memory unit 200.

Arrangements can be made so that reference circuit names can be detected by analyzing the circuit data unit of circuit information, without putting the reference circuit names in the additional information unit (header unit), However, in this case, time for analyzing the circuit data is necessary to detect the reference circuit names. On the other hand, if reference circuit names are put in the additional information unit as in the above-mentioned embodiment, the reference circuit names can be detected directly and immediately.

As has been described above, according to the present invention, an information processing system can be offered which processes at least part of an application program with programmable logic circuits without having to have circuit information of the programmable logic circuits in advance.

According to the present invention, while reusing circuit information designed in the past, the amount of computation for combining circuit information for layout and wirings can be significantly reduced.

According to the present invention, when processing is performed by an application using circuits formed in programmable logic circuits, even in the case where circuit information is generated by a combination of a plurality of basic modules, the circuit information need not have been generated by a combination of a plurality of basic modules before starting the application program, and in the event of the occurrence of modifications or improvements of circuit information for forming the circuit, the circuit information can be re-formed with high flexibility.

What is claimed is:

1. An information processing system that performs at least part of processing of an application program with programmable logic circuits, comprising:

a processing part that includes said programmable logic circuits and performs processing using circuits formed in said programmable logic circuits by instructions from said application program;

a memory part that stores a plurality of pieces of circuit information for forming said circuits in said programmable logic circuits;

an editing part that includes a function to generate circuit information of one circuit specified by specification information by using the plurality of pieces of circuit information stored in said memory part; and an acquisition part that, to identify a circuit to be formed in said programmable logic circuits, passes information specified by said application program, as said specification information, to said editing part, obtains circuit information of the circuit specified by said specification information wherein said circuit information arrives from said editing part, and forms said specified circuit in said programmable logic circuits of said processing part by said circuit information.

2. The information processing system according to claim 1, wherein a portion constituting said memory part, a portion constituting said editing part, and a portion constituting said acquisition part and said processing part are connected over a network.

3. The information processing system according to claim 1, wherein each of a plurality of pieces of circuit information stored in said memory part has an identifier of its own circuit information, and in the case where part or all of said circuit information is formed with other circuit information, has the identifiers of said other circuit information as reference identifiers, as circuit data for forming circuits in said programmable logic circuits; and said editing part generates circuit information of a circuit specified by said specification information passed from said acquisition part by obtaining the circuit information of said specified circuit and the other circuit information indicated by said reference identifiers from said memory part.

4. The information processing system according to claim 3, wherein said editing part, in response to said specification information from said acquisition part, inquires of said memory part about circuit information of a circuit specified by said specification information by an identifier thereof;

said memory part, in response to the inquiry from said editing part, if circuit information indicated by said identifier at the inquiry contains a reference identifier, returns the reference identifier to said editing part; and said editing part uses said reference identifier obtained from said memory part to obtain said other circuit information indicated by said reference identifier from said memory part.

5. The information processing system according to claim 1, wherein each of said plurality of pieces of circuit information stored in said memory part comprises a circuit data unit and an additional information unit thereof;

said additional information unit contains an identifier of its own circuit information, and in the case where part or all of said circuit information is formed with other circuit information, contains the identifiers of said other circuit information as reference identifiers;

said circuit data unit is for forming circuits in said programmable logic circuits, and in the case where part or all of said circuit information is formed with other circuit information, circuit data of the part or all of said circuit information is described using said reference identifiers;

said editing part, in response to said specification information from said acquisition part, inquires of said memory part about circuit information of a circuit specified by said specification information by an identifier thereof;

said memory part, in response to the inquiry from said editing part, if said additional information unit of circuit information indicated by said identifier at the inquiry contains a reference identifier, returns the reference identifier to said editing part; and said editing part uses said reference identifier obtained from said memory part to obtain said other circuit information from said memory part.

6. The information processing system according to claim 5, wherein the circuit data unit of said circuit information stored in said memory part is described by pairs of the address of a configuration memory of said programmable logic circuits and circuit data stored in the address; and in the case where part or all of said circuit information is formed with other circuit information, said reference identifiers are described as circuit data of addresses corresponding to positions where said other circuit information is referenced in said circuit information.

7. The information processing system according to claim 6, wherein said editing part links said other circuit information corresponding to said reference identifier to circuit information in which said reference identifier is contained, in such a way that the address at which said reference identifier is described as circuit data of circuit information of a circuit specified by said specification information is added to all the addresses of the circuit data unit of said other circuit information corresponding to said reference identifier.

8. The information processing system according to claim 6, wherein the respective additional information units of a plurality of pieces of circuit information stored in said memory part contain pairs of a signal input port name and a signal output port name of circuits formed in said programmable logic circuits, and pairs of the coordinates of a signal input port and a signal output port indicated by said signal input port name and signal output port name on said programmable logic circuits.

9. The information processing system according to claim 8, wherein said editing part links said other circuit information corresponding to said reference identifier to circuit information in which said reference identifier is contained, by adding an offset coordinate to the coordinates of signal input ports and signal output ports of circuit information corresponding to said reference identifier, the offset coordinate being calculated from the address where said reference identifier is described as the circuit data of circuit information of a circuit specified by said specification information.

10. The information processing system according to claim 8, wherein said acquisition part separates circuit information obtained from said editing part into pairs of the addresses of configuration memories of said programmable logic circuits and circuit data and pairs of a signal input port name and a signal output port name of circuits formed in said programmable logic circuits and the coordinates of a signal input port and a signal output port indicated by said signal input port name and signal output port name;

loads pairs of the address of a configuration memory of said programmable logic circuits and circuit data into said processing part to form circuits in said programmable logic circuits; and passes, to said application program, pairs of said signal input port name and signal output port name of circuits formed in said programmable logic circuits and the coordinates of a signal input port and a signal output port indicated by said signal input port name and signal output port name.

11. The information processing system according to claim 10, wherein part of said application program is processed in said processing part by inputting and outputting data to and from said processing part based on pairs of the signal input port name and signal output port name of circuits formed in said programmable logic circuits and the coordinates of ports corresponding to said signal input port name and signal output port name, passed from said acquisition part.

12. A circuit information management method which stores in a memory part a plurality of pieces of circuit information of circuits formed in programmable logic circuits, with an identifier assigned to each of them, and when the identifier of a piece of said circuit information is specified, reads the corresponding part of said circuit information from said memory part to form said corresponding part in said programmable logic circuits, wherein each of said plurality of pieces of the circuit information stored in said memory part has an identifier of its own circuit information, and in the case where part or all of said circuit information is formed with other circuit information, has the identifiers of said other circuit information as reference identifiers, as circuit data for forming circuits in said programmable logic circuits.

13. A circuit information management method which stores in a memory part a plurality of pieces of circuit information of circuits formed in programmable logic circuits, with an identifier assigned to each of them, and when the identifier of a piece of said circuit information is specified, reads the corresponding part of said circuit information from said memory part to form said corresponding part in said programmable logic circuits, wherein each of said plurality of pieces of the circuit information stored in said memory part comprises a circuit data unit and an additional information unit thereof;

said additional information unit contains an identifier of its own circuit information, and in the case where part or all of said circuit information is formed with other circuit information, contains the identifiers of said other circuit information as reference identifiers; and said circuit data unit is for forming circuits in said programmable logic circuits, and in the case where part or all of said circuit information is formed with other circuit information, circuit data of the part or all of said circuit information is described using said reference identifiers.

14. The circuit information management method according to claim 13, wherein the circuit data unit of said circuit information stored in said memory part is described by pairs of the address of a configuration memory of said programmable logic circuits and circuit data stored in the address; and in the case where part or all of said circuit information is formed with other circuit information, said reference identifiers are described as circuit data of addresses corresponding to positions where said other circuit information is referenced in said circuit information.

15. The circuit information management method according to claim 13, wherein the additional information unit of each of said plurality of pieces of circuit information stored in said memory part is described with pairs of a signal input port name and a signal output port name of circuits formed in said programmable logic circuits and the coordinates of a signal input port and a signal output port indicated by the signal input port name and signal output port name on said programmable logic circuits.

16. A circuit information storage device in which a plurality of pieces of circuit information of circuits formed in programmable logic circuits is stored with an identifier assigned to each of them, wherein each of said plurality of pieces of the circuit information has an identifier of its own circuit information, and in the case where part or all of said circuit information is formed with other circuit information, has the identifiers of said other circuit information as reference identifiers, as circuit data for forming circuits in said programmable logic circuits.

17. A circuit information storage device in which a plurality of pieces of circuit information of circuits formed in programmable logic circuits is stored with an identifier assigned to each of them, wherein each of said plurality of pieces of the circuit information comprises a circuit data unit and an additional information unit thereof;

said additional information unit contains an identifier of its own circuit information, and in the case where part or all of said circuit information is formed with other circuit information, contains the identifiers of said other circuit information as reference identifiers; and said circuit data unit is for forming circuits in said programmable logic circuits, and in the case where part or all of said circuit information is formed with other circuit information, circuit data of the part or all of said circuit information is described using said reference identifiers.

18. The circuit information storage device according to claim 17, wherein the circuit data unit of said circuit information is described by pairs of the address of a configuration memory of said programmable logic circuits and circuit data stored in the address; and in the case where part or all of said circuit information is formed with other circuit information, said reference identifiers are described as circuit data of addresses corresponding to positions where said other circuit information is referenced in said circuit information.

19. The circuit information storage device according to claim 17, wherein the additional information unit of each of said plurality of pieces of circuit information stored in said memory part is described with pairs of a signal input port name and a signal output port name of circuits formed in said programmable logic circuits and the coordinates of a signal input port and a signal output port indicated by said signal input port name and signal output port name on said programmable logic circuits.

* * * * *